United States Patent
Kitajima

(10) Patent No.: US 12,199,052 B2
(45) Date of Patent: Jan. 14, 2025

(54) RADIO-FREQUENCY MODULE AND COMMUNICATION DEVICE

(71) Applicant: Murata Manufacturing Co., Ltd., Nagaokakyo (JP)

(72) Inventor: Hiromichi Kitajima, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 437 days.

(21) Appl. No.: 17/549,877

(22) Filed: Dec. 14, 2021

(65) Prior Publication Data
US 2022/0102296 A1 Mar. 31, 2022

Related U.S. Application Data

(63) Continuation of application No. PCT/JP2020/025316, filed on Jun. 26, 2020.

(30) Foreign Application Priority Data

Jul. 3, 2019 (JP) .................. 2019-124839

(51) Int. Cl.
*H01L 23/66* (2006.01)
*H01L 25/065* (2023.01)
(Continued)

(52) U.S. Cl.
CPC .......... *H01L 23/66* (2013.01); *H01L 25/0655* (2013.01); *H01Q 1/2283* (2013.01); *H04B 1/034* (2013.01)

(58) Field of Classification Search
CPC ...................................................... H01L 23/66
See application file for complete search history.

(56) References Cited

U.S. PATENT DOCUMENTS

2005/0087438 A1* 4/2005 Heston ................ H01L 25/0655
156/914
2016/0248388 A1* 8/2016 Ilkov ........................ H03F 3/19

FOREIGN PATENT DOCUMENTS

JP 2001-332654 A 11/2001
JP 2016-167577 A 9/2016
(Continued)

OTHER PUBLICATIONS

Office Action issued on Apr. 10, 2023, in corresponding Korean patent Application No. 10-2021-7038728, 5 pages.
(Continued)

*Primary Examiner* — Hsinchun Liao
(74) *Attorney, Agent, or Firm* — XSENSUS LLP

(57) ABSTRACT

To reduce the height in a thickness direction of a mounting substrate. A radio-frequency module includes a mounting substrate, an electronic component, first and second chip components. The electronic component is mounted on a first main surface of the mounting substrate. The first and second chip components are mounted on a second main surface of the mounting substrate. Each of the first and second chip components includes a substrate and a circuit portion. The substrate has first and second main surfaces facing each other. The circuit portion is formed on the first main surface side of the substrate. The second main surface of the substrate in each of the first and second chip components is exposed. A material of the substrate in the first chip component is the same as a material of the substrate in the second chip component.

18 Claims, 12 Drawing Sheets

(51) Int. Cl.
  *H01Q 1/22* (2006.01)
  *H04B 1/034* (2006.01)

(56) References Cited

FOREIGN PATENT DOCUMENTS

| | | |
|---|---|---|
| KR | 2016-0108200 A | 9/2016 |
| WO | 2009/093376 A1 | 7/2009 |
| WO | 2014/017228 A1 | 1/2014 |
| WO | 2018/003268 A1 | 1/2018 |
| WO | 2018/110393 A1 | 6/2018 |
| WO | 2019/054154 A1 | 3/2019 |

OTHER PUBLICATIONS

International Search Report and Written Opinion mailed on Sep. 29, 2020, received for PCT Application PCT/JP2020/025316, Filed on Jun. 26, 2020, 9 pages including English Translation.
English translation of Written Opinion issued Sep. 29, 2020, received for PCT Application PCT/JP2020/025316.

* cited by examiner

RADIO-FREQUENCY MODULE AND COMMUNICATION DEVICE

CROSS-REFERENCE TO RELATED APPLICATIONS

The present application is based on and claims priority to PCT/JP2020/025316, filed Jun. 26, 2020, and Japanese Patent Application No. 2019-124839 filed on Jul. 3, 2019. The entire disclosures of the above-identified applications, including the specifications, drawings and claims are incorporated herein by reference in their entirety.

BACKGROUND

1. Technical Field

The present disclosure generally relates to a radio-frequency module and a communication device, and more particularly relates to a radio-frequency module including a mounting substrate and a plurality of chip components, and a communication device including the radio-frequency module.

2. Description of the Related Art

As an existing radio-frequency module, a front-end module including a substrate (mounting substrate), a filter unit provided on the substrate, a switch IC provided on the substrate, and an amplification unit is known (for example, see WO 2018/110393).

In an example of a front-end module disclosed in WO 2018/110393, a filter unit is provided on one main surface of a substrate, and a switch IC is provided on the other main surface of the substrate.

The front-end module includes a plurality of electrodes (external connection terminals) provided on the other main surface of the substrate.

In addition, WO 2018/110393 discloses a communication device including an RF signal processing circuit that processes a radio-frequency signal transmitted and received by an antenna element, and a front-end module.

In the radio-frequency module, when a component is mounted on each of one main surface and the other main surface of the mounting substrate to reduce the size of the mounting substrate, a reduction in height of the radio-frequency module in a thickness direction of the mounting substrate may be required.

SUMMARY

An aspect of the present disclosure is to provide a radio-frequency module capable of reducing the height in a thickness direction of a mounting substrate and a communication device.

A radio-frequency module according to an aspect of the present disclosure includes a mounting substrate, an electronic component, a first chip component, and a second chip component. The mounting substrate has a first main surface and a second main surface on opposite sides of the substrate. The electronic component is mounted on the first main surface of the mounting substrate. The first chip component and the second chip component are mounted on the second main surface of the mounting substrate. The first chip component and the second chip component include a substrate and a circuit portion. The substrate has a first main substrate surface and a second main substrate surface on opposite sides of the substrate. The circuit portion is formed on the first main substrate surface side of the substrate. In the radio-frequency module, at least a part of the second main substrate surface of the substrate in each of the first chip component and the second chip component is exposed. A material of the substrate in the first chip component and a material of the substrate in the second chip component are a same material.

A radio-frequency module according to an aspect of the present disclosure includes a mounting substrate, an electronic component, a first chip component, and a second chip component. The mounting substrate has a first main surface and a second main surface on opposite sides of the mounting substrate. The electronic component is mounted on the first main surface of the mounting substrate. The first chip component and the second chip component are mounted on the second main surface of the mounting substrate. The first chip component and the second chip component include a substrate and a circuit portion. The substrate has a first main substrate surface and a second main substrate surface on opposite sides of the substrate. The circuit portion is formed on the first main substrate surface side of the substrate. A material of the substrate in the first chip component and a material of the substrate in the second chip component are a same material. Under a condition a plane including a bonding region with a bump connected to the first chip component on the second main surface of the mounting substrate is defined as a reference plane, the first chip component and the second chip component have a same distance between the reference plane and the second main substrate surface of the substrate in a thickness direction of the mounting substrate.

A communication device according to an aspect of the present disclosure includes a signal processing circuit and the radio-frequency module according to the above aspect. The signal processing circuit performs signal processing on a reception signal from an antenna and a transmission signal to the antenna. The radio-frequency module transmits the reception signal and the transmission signal between the antenna and the signal processing circuit.

Other features, elements, characteristics, and advantages of the present disclosure will become more apparent from the following detailed description of preferred embodiments of the present disclosure with reference to the attached drawings.

DESCRIPTION OF THE PREFERRED EMBODIMENTS

Figure 1:
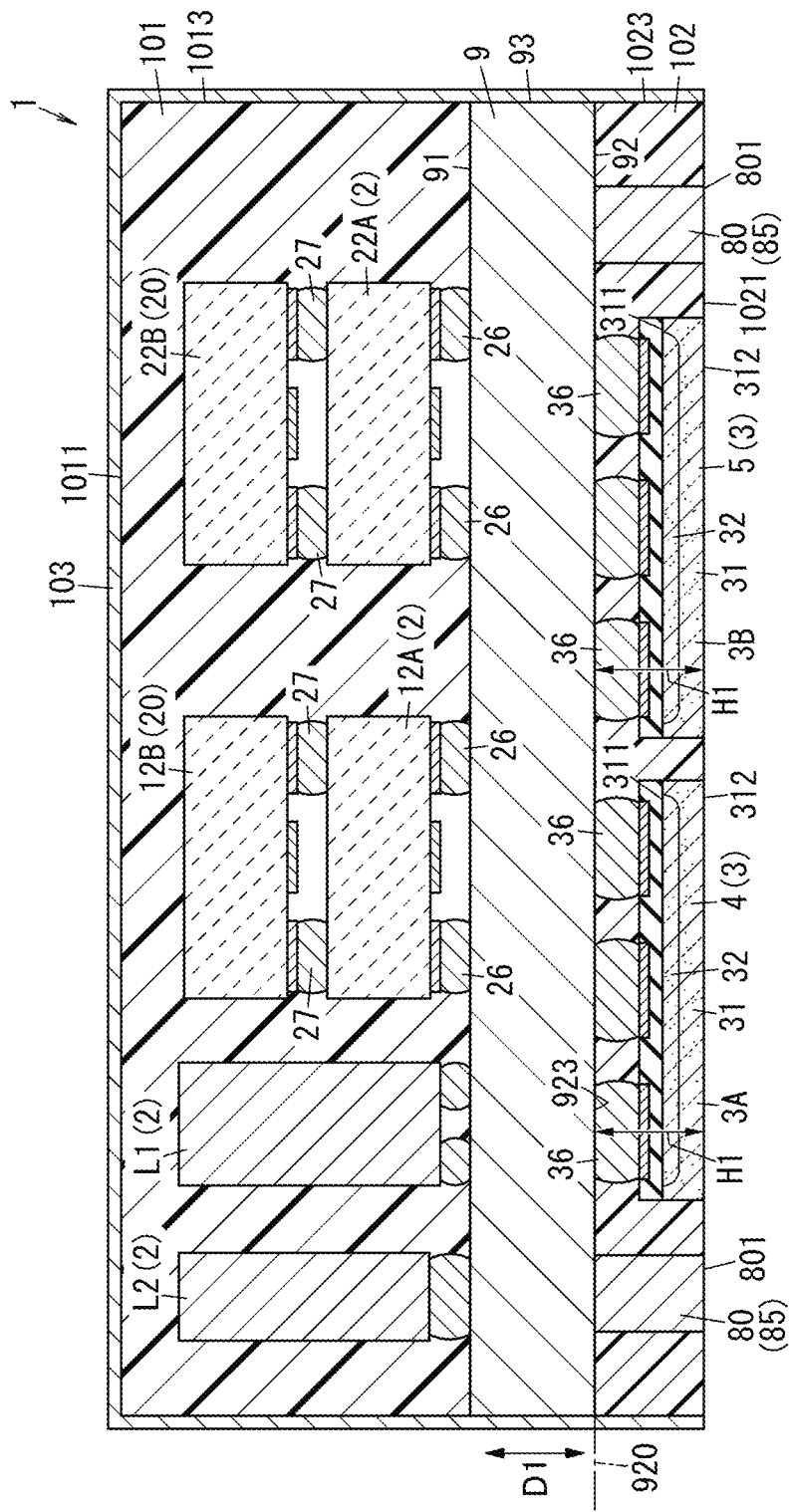
FIG. 1 is a cross-sectional view of a radio-frequency module according to an embodiment.

All of FIGS. 1, 3, 5 to 7, and 9 to 12 referred to in the following embodiments and the like are schematic diagrams, and ratios of sizes and thicknesses of respective components in the diagrams do not necessarily reflect actual dimensional ratios.

Embodiment

Hereinafter, a radio-frequency module 1 and a communication device 300 according to an embodiment will be described with reference to FIGS. 1 and 2.

1. Radio-Frequency Module and Communication Device 1.1. Circuit Configuration of Radio-Frequency Module and Communication Device A circuit configuration of the radio-frequency module 1 and the communication device 300 according to the embodiment will be described with reference to FIG. 2.

The radio-frequency module 1 according to the embodiment is used in, for example, the communication device 300. The communication device 300 is, for example, a mobile phone (for example, a smartphone), but is not limited thereto, and may be, for example, a wearable terminal (for example, a smart watch), or the like. The radio-frequency module 1 is a module compatible with, for example, the 4G (fourth generation mobile communication) standard, the 5G (fifth generation mobile communication) standard, or the like. The 4G standard is, for example, the 3GPP LTE (Long Term Evolution) standard. The 5G standard is, for example, 5G NR (New Radio). The radio-frequency module 1 is a module capable of supporting carrier aggregation and dual connectivity.

For example, the radio-frequency module 1 is configured so as to amplify a transmission signal input from a signal processing circuit 301 and output the amplified transmission signal to an antenna 310. Further, the radio-frequency module 1 is configured so as to amplify a reception signal input from the antenna 310 and output the amplified reception signal to the signal processing circuit 301. The signal processing circuit 301 is not a constituent element of the radio-frequency module 1 but a constituent element of the communication device 300 including the radio-frequency module 1. The radio-frequency module 1 according to the embodiment is controlled by, for example, the signal processing circuit 301 included in the communication device 300. The communication device 300 includes the radio-frequency module 1 and the signal processing circuit 301. The communication device 300 further includes the antenna 310. The communication device 300 further includes a circuit board on which the radio-frequency module 1 is mounted. The circuit board is, for example, a printed wiring board. The circuit board has a ground electrode to which a ground potential is applied.

The signal processing circuit 301 includes, for example, an RF signal processing circuit 302 and a baseband signal processing circuit 303. The RF signal processing circuit 302 is, for example, an RFIC (Radio Frequency Integrated Circuit), and performs signal processing on a radio-frequency signal. For example, the RF signal processing circuit 302 performs signal processing such as up-conversion on a radio-frequency signal (transmission signal) output from the baseband signal processing circuit 303, and outputs the radio-frequency signal subjected to the signal processing. For example, the RF signal processing circuit 302 performs signal processing such as down-conversion on a radio-frequency signal (reception signal) output from the radio-frequency module 1, and outputs the radio-frequency signal subjected to the signal processing to the baseband signal processing circuit 303. The baseband signal processing circuit 303 is, for example, a BBIC (Baseband Integrated Circuit), and performs predetermined signal processing on a transmission signal from the outside of the signal processing circuit 301. The reception signal processed by the baseband signal processing circuit 303 is used, for example, for image display as an image signal or for communication as an audio signal. The radio-frequency module 1 transmits a radio-frequency signal (a reception signal, a transmission signal) between the antenna 310 and the RF signal processing circuit 302 of the signal processing circuit 301. In the communication device 300, the baseband signal processing circuit 303 is not an essential constituent element.

The radio-frequency module 1 according to the embodiment includes a power amplifier 11 and a low-noise amplifier 21. The radio-frequency module 1 includes two transmission filters 12A and 12B, two reception filters 22A and 22B, and a transmission/reception filter 24. The radio-frequency module 1 includes an output matching circuit 13 and an input matching circuit 23. The radio-frequency module 1 includes a first switch 4, a second switch 5, a third switch 6, and a fourth switch 7.

The radio-frequency module 1 includes a plurality of external connection terminals 80. The plurality of external connection terminals 80 includes an antenna terminal 81, a signal input terminal 82, a signal output terminal 83, and a plurality of ground terminals 85. In FIG. 1, only two external connection terminals 80 among the plurality of external connection terminals 80 are illustrated. The plurality of ground terminals 85 is a terminal which is electrically connected to the ground electrode of the above-described circuit board included in the communication device 300 and to which a ground potential is applied.

The power amplifier 11 has an input terminal 111 and an output terminal 112. The power amplifier 11 amplifies a transmission signal of a first frequency band input to the input terminal 111 and outputs the amplified signal from the output terminal 112. Here, the first frequency band includes, for example, a first communication band, a second communication band, and a third communication band. The first communication band corresponds to a transmission signal passing through the transmission filter 12A, and is, for example, Band 11 of the 3GPP LTE standard. The second communication band corresponds to a transmission signal passing through the transmission filter 12B, and is, for example, Band 22 of the 3GPP LTE standard. The third communication band corresponds to a transmission signal passing through the transmission/reception filter 24, and is, for example, Band 42, Band 48 of the 3GPP LTE standard, or n77 of the 5G NR standard. The input terminal 111 of the power amplifier 11 is connected to the signal input terminal 82. The input terminal 111 of the power amplifier 11 is connected to the signal processing circuit 301 via the signal input terminal 82. The signal input terminal 82 is a terminal for inputting a radio-frequency signal (transmission signal) from an external circuit (for example, the signal processing circuit 301) to the radio-frequency module 1. The output terminal 112 of the power amplifier 11 is connected to a common terminal 50 of the second switch 5 via the output matching circuit 13.

The low-noise amplifier 21 has an input terminal 211 and an output terminal 212. The low-noise amplifier 21 amplifies a reception signal in a second frequency band input to the input terminal 211 and outputs the amplified reception signal from the output terminal 212. The second frequency band is, for example, the same as the first frequency band, and includes the first communication band, the second communication band, and the third communication band. The input terminal 211 of the low-noise amplifier 21 is connected to a common terminal 60 of the third switch 6 via the input matching circuit 23. The output terminal 212 of the low-noise amplifier 21 is connected to the signal output terminal 83. The output terminal 212 of the low-noise amplifier 21 is connected to the signal processing circuit 301 via, for example, the signal output terminal 83. The signal output terminal 83 is a terminal for outputting a radio-frequency signal (reception signal) from the low-noise amplifier 21 to an external circuit (for example, the signal processing circuit 301).

The transmission filter 12A is, for example, a filter whose pass band is a transmission band of the first communication band. The transmission filter 12B is, for example, a filter whose pass band is a transmission band of the second communication band. The reception filter 22A is, for example, a filter whose pass band is a reception band of the first communication band. The reception filter 22B is, for example, a filter whose pass band is a reception band of the second communication band. The transmission/reception filter 24 is, for example, a filter whose pass band is a transmission/reception band of the third communication band.

The first switch 4 includes a common terminal 40 and three selection terminals 41 to 43. The common terminal 40 is connected to the antenna terminal 81. The antenna 310 is connected to the antenna terminal 81. The selection terminal 41 is connected to a connection point between an output terminal of the transmission filter 12A and an input terminal of the reception filter 22A. The selection terminal 42 is connected to a connection point between an output terminal of the transmission filter 12B and an input terminal of the reception filter 22B. The selection terminal 43 is connected to the transmission/reception filter 24. The first switch 4 is, for example, a switch capable of connecting at least one or more among the three selection terminals 41 to 43 to the common terminal 40. Here, the first switch 4 is, for example, a switch for which one-to-one and one-to-many connections are possible.

The first switch 4 is controlled by, for example, the signal processing circuit 301. The first switch 4 switches a connection state between the common terminal 40 and the three selection terminals 41 to 43 in accordance with a control signal from the RF signal processing circuit 302 of the signal processing circuit 301. The first switch 4 is, for example, a switch IC (Integrated Circuit).

The second switch 5 includes the common terminal 50 and three selection terminals 51 to 53. The common terminal 50 is connected to the output terminal 112 of the power amplifier 11 via the output matching circuit 13. The selection terminal 51 is connected to an input terminal of the transmission filter 12A. The selection terminal 52 is connected to an input terminal of the transmission filter 12B. The selection terminal 53 is connected to a selection terminal 71 of the fourth switch 7. The second switch 5 is, for example, a switch capable of connecting at least one or more among the three selection terminals 51 to 53 to the common terminal 50. Here, the second switch 5 is, for example, a switch for which one-to-one and one-to-many connections are possible.

The second switch 5 is controlled by, for example, the signal processing circuit 301. The second switch 5 switches a connection state between the common terminal 50 and the three selection terminals 51 to 53 in accordance with a control signal from the RF signal processing circuit 302 of the signal processing circuit 301. The second switch 5 is, for example, a switch IC.

The third switch 6 includes the common terminal 60 and three selection terminals 61 to 63. The common terminal 60 is connected to the input terminal 211 of the low-noise amplifier 21 via the input matching circuit 23. The selection terminal 61 is connected to an output terminal of the reception filter 22A. The selection terminal 62 is connected to an output terminal of the reception filter 22B. The selection terminal 63 is connected to a selection terminal 72 of the fourth switch 7. The third switch 6 is, for example, a switch capable of connecting at least one or more among the three selection terminals 61 to 63 to the common terminal 60. Here, the third switch 6 is, for example, a switch for which one-to-one and one-to-many connections are possible.

The third switch 6 is controlled by, for example, the signal processing circuit 301. The third switch 6 switches the connection state between the common terminal 60 and the three selection terminals 61 to 63 in accordance with a control signal from the RF signal processing circuit 302 of the signal processing circuit 301. The third switch 6 is, for example, a switch IC.

The fourth switch 7 includes a common terminal 70 and the above-described two selection terminals 71 and 72. The common terminal 70 is connected to one input/output terminal of the two input/output terminals of the transmission/reception filter 24. The selection terminal 71 is connected to the selection terminal 53 of the second switch 5. The selection terminal 72 is connected to the selection terminal 63 of the third switch 6. In the fourth switch 7, the two selection terminals 71 and 72 are exclusively connected to the common terminal 70. The fourth switch 7 can be configured by, for example, an SPDT (Single Pole Double Throw) type switch. The fourth switch is, for example, a switch IC.

The output matching circuit 13 is provided in a signal path between the output terminal 112 of the power amplifier 11 and the common terminal 50 of the second switch 5. The output matching circuit 13 is a circuit for performing impedance matching between the power amplifier 11 and the transmission filters 12A and 12B and the transmission/reception filter 24. The output matching circuit 13 is configured by, for example, one inductor L1 (see FIG. 1), but is not limited thereto, and may include, for example, a plurality of inductors and a plurality of capacitors.

The input matching circuit 23 is provided in a signal path between the input terminal 211 of the low-noise amplifier 21 and the common terminal 60 of the third switch 6. The input matching circuit 23 is a circuit for performing impedance matching between the low-noise amplifier 21 and the reception filters 22A and 22B and the transmission/reception filter 24. The input matching circuit 23 is configured by, for example, one inductor L2 (see FIG. 1), but is not limited thereto, and may include, for example, a plurality of inductors and a plurality of capacitors.

Since the radio-frequency module 1 includes the fourth switch 7, simultaneous transmission and reception of a transmission signal (radio-frequency signal for transmission) in a predetermined frequency band and a reception signal (radio-frequency signal for reception) in a predetermined frequency band can be realized in a pseudo manner by, for example, TDD (Time Division Duplex). Here, the pseudo realization means that the transmission of the transmission signal and the reception of the reception signal are not performed at the same time, but are performed in a short period of time that can be regarded as simultaneous.

1.2. Structure of Radio-Frequency Module

Hereinafter, the structure of the radio-frequency module 1 will be described with reference to FIG. 1.

The radio-frequency module 1 includes a mounting substrate 9, a plurality of circuit elements, and the plurality of external connection terminals 80.

The mounting substrate 9 has a first main surface 91 and a second main surface 92 on opposite sides of the mounting substrate 9. The mounting substrate 9 is, for example, a printed wiring board, an LTCC (Low Temperature Co-fired Ceramics) substrate, or the like. Here, the mounting substrate 9 is, for example, a multilayer substrate including a plurality of dielectric layers and a plurality of conductor pattern layers. The plurality of dielectric layers and the plurality of conductor pattern layers are laminated in a thickness direction D1 of the mounting substrate 9. The plurality of conductor pattern layers is each formed in a predetermined pattern. Each of the plurality of conductor pattern layers includes one or a plurality of conductor portions in one plane orthogonal to the thickness direction D1 of the mounting substrate 9. A material of each conductor pattern layer is, for example, copper. The plurality of conductor pattern layers includes a ground layer. In the radio-frequency module 1, the plurality of ground terminals 85 and the ground layer are electrically connected to each other via a via conductor or the like included in the mounting substrate 9.

The first main surface 91 and the second main surface 92 of the mounting substrate 9 are apart from each other in the thickness direction D1 of the mounting substrate 9, and intersect with the thickness direction D1 of the mounting substrate 9. The first main surface 91 of the mounting substrate 9 is orthogonal to the thickness direction D1 of the mounting substrate 9, for example, however, the first main surface 91 may include, for example, a side surface or the like of the conductor portion as a surface that is not orthogonal to the thickness direction D1. In addition, the second main surface 92 of the mounting substrate 9 is orthogonal to the thickness direction D1 of the mounting substrate 9, for example, however, the second main surface 92 may include, for example, a side surface or the like of the conductor portion as a surface that is not orthogonal to the thickness direction D1. In addition, the first main surface 91 and the second main surface 92 of the mounting substrate 9 may be formed with fine irregularities, concave portions, or convex portions.

The radio-frequency module 1 includes, as a plurality of circuit elements, the power amplifier 11, the low-noise amplifier 21, the two transmission filters 12A and 12B, the two reception filters 22A and 22B, the transmission/reception filter 24, the output matching circuit 13, and the input matching circuit 23. The plurality of circuit elements of the radio-frequency module 1 is mounted on the mounting substrate 9. The plurality of circuit elements is not limited to electronic components mounted on the mounting substrate 9, and circuit elements provided in the mounting substrate 9 may be included. In FIG. 1, circuit elements other than the first switch 4, the second switch 5, the two transmission filters 12A and 12B, the two reception filters 22A and 22B, and the two inductors L1 and L2 among the plurality of circuit elements are not illustrated. Here, in the radio-frequency module 1 according to the embodiment, each of the transmission filter 12A, the reception filter 22A, and the two inductors L1 and L2 is mounted on the first main surface 91 of the mounting substrate 9. In the radio-frequency module 1, the transmission filter 12B is arranged on the transmission filter 12A on the first main surface 91 side of the mounting substrate 9. The reception filter 22B is arranged on the reception filter 22A on the first main surface 91 side of the mounting substrate 9. In the radio-frequency module 1, each of the first switch 4 and the second switch 5 is mounted on the second main surface 92 of the mounting substrate 9. The first switch 4 is provided in both a signal path for the transmission signal and a signal path for the reception signal. In the radio-frequency module 1, the first switch 4 is provided in a signal path for a transmission signal in which the power amplifier 11, the output matching circuit 13, the second switch 5, and the transmission filter 12A are provided. The first switch 4 is provided in a signal path for a transmission signal in which the power amplifier 11, the output matching circuit 13, the second switch 5, and the transmission filter 12B are provided. The first switch 4 is provided in a signal path for a transmission signal in which the power amplifier 11, the output matching circuit 13, the fourth switch 7, and the transmission/reception filter 24 are provided. The first switch 4 is provided in a signal path for a reception signal in which the reception filter 22A, the third switch 6, the input matching circuit 23, and the low-noise amplifier 21 are provided. The first switch 4 is provided in a signal path for a reception signal in which the reception filter 22B, the third switch 6, the input matching circuit 23, and the low-noise amplifier 21 are provided. The first switch 4 is provided in a signal path for a reception signal in which the transmission/reception filter 24, the fourth switch 7, the input matching circuit 23, and the low-noise amplifier 21 are provided. In the radio-frequency module 1 according to the embodiment, the third switch 6, the fourth switch 7, and the low-noise amplifier 21 are mounted on the second main surface 92 of the mounting substrate 9.

In the radio-frequency module 1, the power amplifier 11 is a chip component (IC chip) including a substrate having a first main surface and a second main surface facing each other, and a circuit portion (IC portion) including at least one transistor formed on the first main surface side of the substrate. The substrate is, for example, a gallium arsenide substrate. The circuit portion has a function of amplifying a transmission signal input to the input terminal 111 of the power amplifier 11. The transistor is, for example, an HBT (Heterojunction Bipolar Transistor). The power amplifier 11 may include, for example, a DC cut capacitor. The chip component configuring the power amplifier 11 is flip-chip mounted on the first main surface 91 of the mounting substrate 9 such that the first main surface of the first main surface and the second main surface of the substrate is on the first main surface 91 side of the mounting substrate 9. In a plan view from the thickness direction D1 of the mounting substrate 9, the outer peripheral shape of the power amplifier 11 is a substantially quadrilateral shape.

The low-noise amplifier 21 is, for example, a chip component (IC chip) including a substrate having a first main surface and a second main surface facing each other and a circuit portion (IC portion) formed on the first main surface side of the substrate. The substrate is, for example, a silicon substrate. The circuit portion has a function of amplifying a reception signal input to the input terminal 211 of the low-noise amplifier 21. The circuit portion includes a transistor. The low-noise amplifier 21 is flip-chip mounted on the second main surface 92 of the mounting substrate 9 such that the first main surface of the first main surface and the second main surface of the substrate is on the second main surface 92 side of the mounting substrate 9. In a plan view from the thickness direction D1 of the mounting substrate 9, the outer peripheral shape of the low-noise amplifier 21 is a substantially quadrilateral shape.

Each of the two transmission filters 12A and 12B, the two reception filters 22A and 22B, and the transmission/reception filter 24 is, for example, a chip component. In short, in a plan view from the thickness direction D1 of the mounting substrate 9, the outer peripheral shape of each of the transmission filters 12A and 12B, the two reception filters 22A and 22B, and the transmission/reception filter 24 is a substantially quadrilateral shape.

Each of the two transmission filters 12A and 12B, the two reception filters 22A and 22B, and the transmission/reception filter 24 is, for example, a ladder filter, and includes a plurality of (for example, four) series arm resonators and a plurality of (for example, three) parallel arm resonators. Each of the two transmission filters 12A and 12B, the two reception filters 22A and 22B, and the transmission/reception filter 24 is, for example, an acoustic wave filter, and each of the plurality of series arm resonators and the plurality of parallel arm resonators is formed of an acoustic wave resonator. The acoustic wave filter is, for example, a surface acoustic wave filter using a surface acoustic wave.

In the surface acoustic wave filter, each of the plurality of series arm resonators and the plurality of parallel arm resonators is, for example, a SAW (Surface Acoustic Wave) resonator.

Here, the surface acoustic wave filter is, for example, a chip component including a substrate having a first main surface and a second main surface, and a circuit portion formed on the first main surface side of the substrate. The substrate is a piezoelectric substrate. The piezoelectric substrate is, for example, a lithium tantalate substrate, a lithium niobate substrate, or the like. The circuit portion includes a plurality of IDT (Interdigital Transducer) electrodes corresponding one to one to the plurality of series arm resonators and a plurality of IDT electrodes corresponding one to one to the plurality of parallel arm resonators.

The transmission filter 12A and the reception filter 22A are mounted on the first main surface 91 of the mounting substrate 9. The transmission filter 12A and the reception filter 22A are arranged such that the first main surface of the first main surface and the second main surface of the substrate is on the mounting substrate 9 side.

Each of the first switch 4, the second switch 5, the third switch 6, and the fourth switch 7 is a switch IC. More specifically, each of the first switch 4, the second switch 5, the third switch 6, and the fourth switch 7 is, for example, a chip component (IC chip) including a substrate having a first main surface and a second main surface facing each other, and a circuit portion (IC portion) including a FET (Field Effect Transistor) formed on the first main surface side of the substrate. The substrate is, for example, a silicon substrate. The circuit portion is a functional portion having a function of switching a connection state. Each of the first switch 4, the second switch 5, the third switch 6, and the fourth switch 7 is flip-chip mounted on the second main surface 92 of the mounting substrate 9 such that the first main surface of the first main surface and the second main surface of the substrate is on the second main surface 92 side of the mounting substrate 9. In a plan view from the thickness direction D1 of the mounting substrate 9, the outer peripheral shape of the chip component configuring each of the first switch 4, the second switch 5, the third switch 6, and the fourth switch 7 is a substantially quadrilateral shape.

The inductor L1 in the output matching circuit 13 is, for example, a chip inductor. The inductor L1 in the output matching circuit 13 is mounted on, for example, the first main surface 91 of the mounting substrate 9, but is not limited thereto. In a plan view from the thickness direction D1 of the mounting substrate 9, the outer peripheral shape of the inductor L1 is a substantially quadrilateral shape.

The inductor L2 in the input matching circuit 23 is, for example, a chip inductor. The inductor L2 in the input matching circuit 23 is mounted on, for example, the first main surface 91 of the mounting substrate 9, but is not limited thereto. In a plan view from the thickness direction D1 of the mounting substrate 9, the outer peripheral shape of the inductor L2 is a substantially quadrilateral shape.

The plurality of external connection terminals 80 is arranged on the second main surface 92 of the mounting substrate 9. A material of the plurality of external connection terminals 80 is, for example, metal (for example, copper, a copper alloy, or the like). Each of the plurality of external connection terminals 80 is a substantially columnar electrode. Here, the columnar electrode is, for example, a substantially circular columnar electrode.

The plurality of external connection terminals 80 includes the plurality of ground terminals 85 in addition to the antenna terminal 81, the signal input terminal 82, and the signal output terminal 83 described above. In FIG. 1, only two ground terminals 85 among the plurality of ground terminals 85 in the plurality of external connection terminals 80 are illustrated. The plurality of ground terminals 85 is electrically connected to a ground layer of the mounting substrate 9 as described above. The ground layer is a circuit ground of the radio-frequency module 1, and the plurality of circuit elements of the radio-frequency module 1 includes circuit elements electrically connected to the ground layer.

The radio-frequency module 1 further includes a first resin layer 101 that covers a plurality of electronic components 2 and the like mounted on the first main surface 91 of the mounting substrate 9 on the first main surface 91 side of the mounting substrate 9. In the radio-frequency module 1, the plurality of electronic components 2 includes the transmission filter 12A, the reception filter 22A, the inductor L1, and the inductor L2. The plurality of electronic components 2 includes, for example, the power amplifier 11 in addition to the transmission filter 12A, the reception filter 22A, the inductor L1, and the inductor L2. Each of the plurality of electronic components 2 is mounted on the first main surface 91 of the mounting substrate 9 by a plurality of bumps 26, for example. Here, the radio-frequency module 1 includes two electronic components 20 arranged so as to overlap two electronic components 2 in a one-to-one relationship among the plurality of electronic components 2 mounted on the first main surface 91 of the mounting substrate 9. The two electronic components 20 are bonded to the corresponding electronic component 2 of the two electronic components 2 by a plurality of bumps 27. The two electronic components 20 are the transmission filter 12B and the reception filter 22B. The first resin layer 101 covers two electronic components 20 in addition to the plurality of electronic components 2. The electronic component 20 overlapping the electronic component 2 in the thickness direction D1 of the mounting substrate 9 is electrically connected to the mounting substrate 9 via, for example, the bump 27 and a through electrode of the electronic component 2. The electronic component 20 is mounted on the mounting substrate 9 with the electronic component 2 interposed therebetween. The electronic component 20 and the electronic component 2 overlapping in the thickness direction D1 of the mounting substrate 9 have the same size when viewed from the thickness direction D1, but are not limited thereto, and may have the different sizes from each other. For example, in a set of the electronic component 20 and the electronic component 2 overlapping in the thickness direction D1 of the mounting substrate 9, the electronic component 2 positioned between the mounting substrate 9 and the electronic component 20 in the thickness direction D1 of the mounting substrate 9 may be larger than the electronic component 20. In this case, it is not limited to the example in which the electronic component 20 is electrically connected to the mounting substrate 9 via the bump 27 and the through electrode of the electronic component 2, and, for example, the electronic component 20 may be electrically connected to the mounting substrate 9 via the bump 27 and a bonding wire. The first resin layer 101 may contain a filler in addition to resin.

The radio-frequency module 1 further includes a second resin layer 102 that covers a part of a plurality of chip components 3 and the like mounted on the second main surface 92 of the mounting substrate 9 on the second main surface 92 side of the mounting substrate 9. Each of the plurality of chip components 3 is mounted on the second main surface 92 of the mounting substrate 9 by a plurality of bumps 36, for example. In the radio-frequency module 1, the plurality of chip components 3 includes a first chip component 3A (first switch 4) and a second chip component 3B (second switch 5). In FIG. 1, each of the plurality of chip components 3 includes a substrate (hereinafter, also referred to as a substrate 31) and a circuit portion (hereinafter, also referred to as a circuit portion 32) as described above. The substrate 31 has a first main surface 311 and a second main surface 312 facing each other. The substrate 31 is, for example, a silicon substrate. The circuit portion 32 is formed on the first main surface 311 side of the substrate 31. The plurality of chip components 3 includes, for example, the third switch 6, the fourth switch 7, and the low-noise amplifier 21 in addition to, for example, the first chip component 3A (first switch 4) and the second chip component 3B (second switch 5). The second resin layer 102 is formed so as to expose the second main surface 312 of the substrate 31 in each of the plurality of chip components 3. Therefore, the second resin layer 102 is formed so as to expose the second main surface 312 of the substrate 31 in each of the first chip component 3A and the second chip component 3B. The second resin layer 102 may contain a filler in addition to the resin. A material of the second resin layer 102 may be the same as or different from a material of the first resin layer 101.

The radio-frequency module 1 further includes a shield layer 103. A material of the shield layer 103 is, for example, metal. The shield layer 103 covers a main surface 1011 and an outer peripheral surface 1013 of the first resin layer 101, an outer peripheral surface 93 of the mounting substrate 9, and an outer peripheral surface 1023 of the second resin layer 102. The shield layer 103 is in contact with the ground layer of the mounting substrate 9. Thus, the potential of the shield layer 103 can be made equal to the potential of the ground layer.

2. Method of Manufacturing Radio-Frequency Module

In the method of manufacturing the radio-frequency module, for example, a first process in which a plurality of circuit elements is mounted on the mounting substrate 9 is performed. In the first process, a step of mounting the plurality of electronic components 2 on the first main surface 91 of the mounting substrate 9 is performed, and then a step of arranging the two electronic components 20 on the two electronic components 2 is performed. In the first process, a step of mounting the plurality of chip components 3 on the second main surface 92 of the mounting substrate 9 is performed. In the first process, either the step of mounting the plurality of electronic components 2 on the first main surface 91 of the mounting substrate 9 or the step of mounting the plurality of chip components 3 on the second main surface 92 of the mounting substrate 9 may be performed first. Further, in the first process, a step of arranging a plurality of conductor pillars serving as a base for the plurality of external connection terminals 80 on the second main surface 92 of the mounting substrate 9 is performed.

After the above-described first process, a second process is performed. In the second process, a step of forming the first resin layer 101 that covers the plurality of electronic components 2 and the plurality of electronic components 20 on the first main surface 91 side of the mounting substrate 9 and a step of forming a resin layer that covers the plurality of chip components 3 and the plurality of conductor pillars on the second main surface 92 side of the mounting substrate 9 and serves as a base for the second resin layer 102 are performed.

After the above-described second process, a third process is performed. In the third process, the resin layer or the like formed in the second process is ground from the surface opposite to the mounting substrate 9 side. Here, in the third process, the second resin layer 102 is formed by grinding the resin layer. In the third process, after the second main surface 312 of the substrate 31 in at least one chip component 3 among the plurality of chip components 3 is exposed by grinding the resin layer, by further performing grinding, the substrate 31 of at least two chip components 3 among the plurality of chip components 3 is ground to reduce the thickness of the substrate 31. In the third process, the plurality of external connection terminals 80 is formed by grinding the plurality of conductor pillars. In the method of manufacturing the radio-frequency module, in the third process, the second main surface 312 of the substrate 31 of each of the plurality of chip components 3 and a tip surface 801 of each of the plurality of external connection terminals 80 are exposed.

After the above-described third process, a fourth process is performed. In the fourth process, the shield layer 103 is formed. Note that the first process, the second process, and the third process may be performed on a substrate with multiple substrates that includes a plurality of mounting substrates 9 and is capable of being performed on the multiple substrates. In this case, for example, the fourth process may be performed after the substrate including multiple mounting substrates 9 being separated into individual mounting substrate 9, after the third process.

3. Summary 3.1. Radio-frequency Module

The radio-frequency module 1 according to the embodiment includes the mounting substrate 9, the electronic component 2, the first chip component 3A, and the second chip component 3B. The mounting substrate 9 has the first main surface 91 and the second main surface 92 facing each other. The electronic component 2 is mounted on the first main surface 91 of the mounting substrate 9. The first chip component 3A and the second chip component 3B are mounted on the second main surface 92 of the mounting substrate 9. Each of the first chip component 3A and the second chip component 3B includes the substrate 31 and the circuit portion 32. The substrate 31 has the first main surface 311 and the second main surface 312 facing each other. The circuit portion 32 is formed on the first main surface 311 side of the substrate 31. In the radio-frequency module 1, the second main surface 312 of the substrate 31 in each of the first chip component 3A and the second chip component 3B is exposed. A material of the substrate 31 in the first chip component 3A and a material of the substrate 31 in the second chip component 3B are the same. "A material of the substrate 31 in the first chip component 3A and a material of the substrate 31 in the second chip component 3B are the same" means that the main components of the substrates 31 are the same. The main component does not contain impurities. For example, in the case where the substrate 31 is a silicon substrate, the main component of the substrate 31 is silicon and does not contain impurities (for example, boron, phosphorus, or the like) added to the silicon substrate.

In the radio-frequency module 1 according to the embodiment, the height of the radio-frequency module 1 in the thickness direction D1 of the mounting substrate 9 can be reduced.

The substrate 31 is a silicon substrate, but may include a natural oxide film (silicon oxide film) having a thickness of about 20 nm to 100 nm on the second main surface 312 side, in this case, "the second main surface 312 of the substrate 31 is exposed" includes that the silicon oxide film is exposed.

Figure 2:
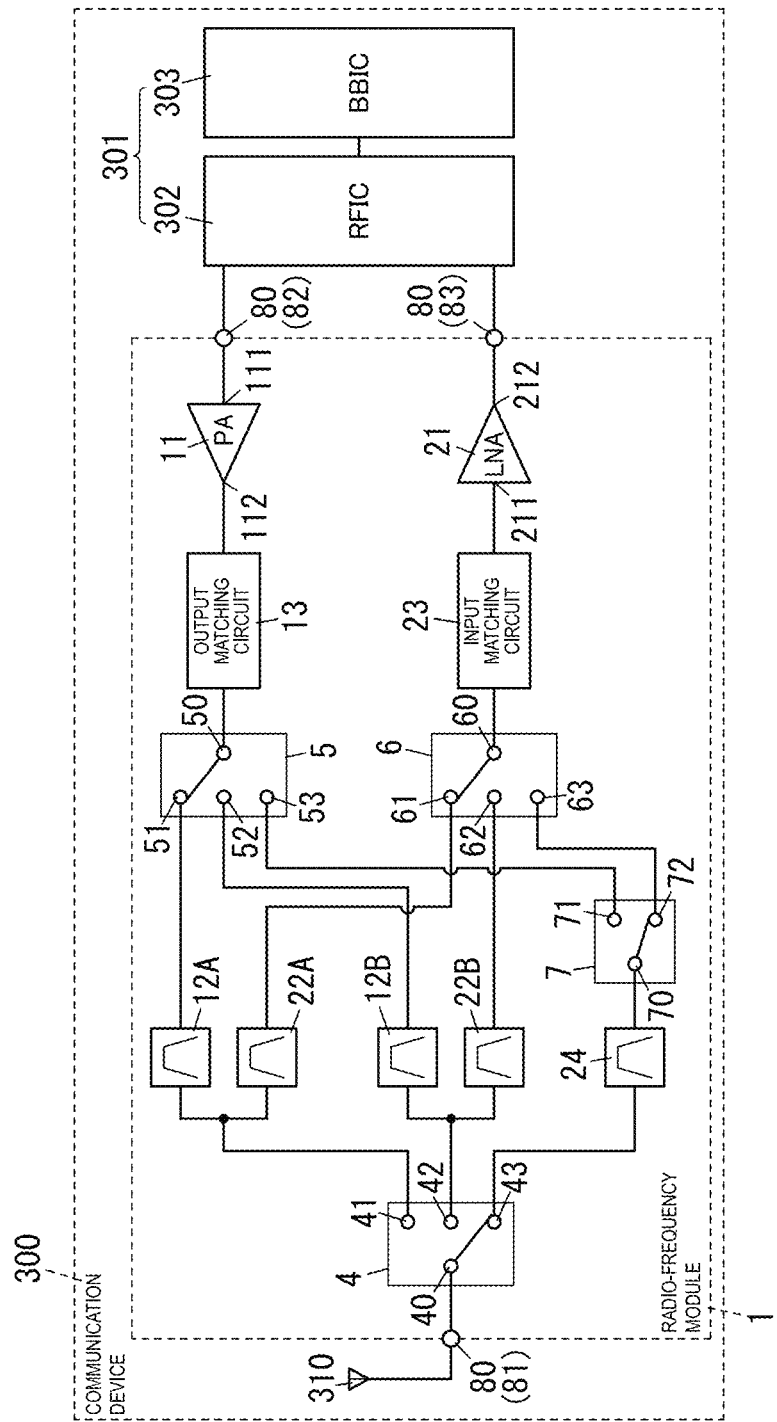
FIG. 2 is a circuit configuration diagram of a communication device including the above radio-frequency module.
Figure 3:
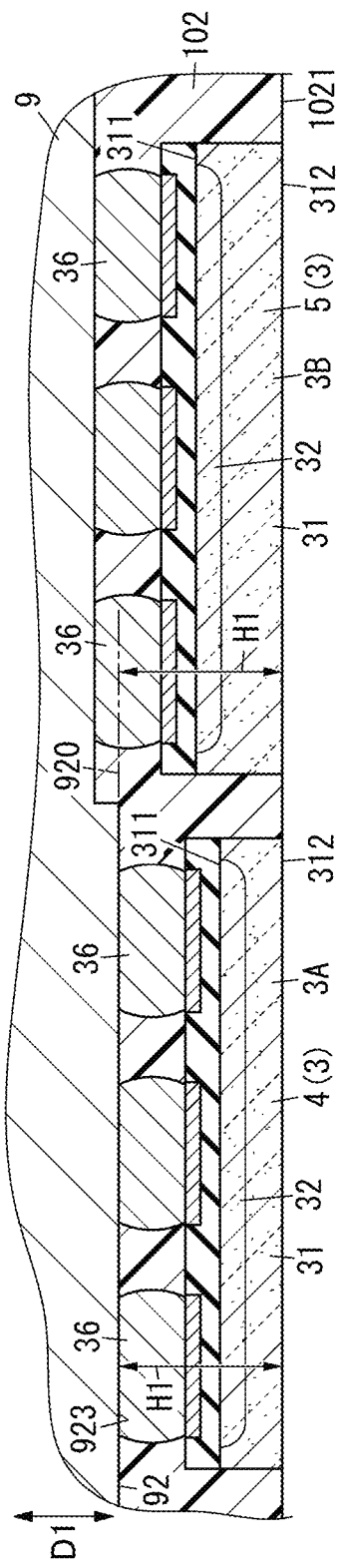
FIG. 3 is an explanatory view of a main part of the radio-frequency module according to the embodiment.

In the radio-frequency module 1 according to the embodiment, as illustrated in FIGS. 1 and 3, regardless of the shape of the second main surface 92 of the mounting substrate 9, when a plane including a bonding region 923 of the bump 36 connected to the first chip component 3A in the second main surface 92 of the mounting substrate 9 is defined as a reference plane 920, a distance H1 between the reference plane 920 and the second main surface 312 of the substrate 31 in the thickness direction D1 of the mounting substrate 9 in the first chip component 3A is the same as that in the second chip component 3B. Accordingly, in the radio-frequency module 1 according to the embodiment, it is possible to reduce the height of the radio-frequency module 1 in the thickness direction D1 of the mounting substrate 9. In the radio-frequency module according to the embodiment, the second main surface 312 of the substrate 31 of each of the first chip component 3A and the second chip component 3B, the main surface 1021 of the second resin layer 102, and the tip surface 801 of each of the plurality of external connection terminals 80 are substantially flush with one another. In the radio-frequency module 1 according to the embodiment, when the first chip component 3A and the second chip component 3B have the same distance H1 between the reference plane 920 and the second main surface 312 of the substrate 31 in the thickness direction D1 of the mounting substrate 9, a conductor layer or an insulating layer may be laminated on the second main surface 312 of at least one substrate 31 of the first chip component 3A and the second chip component 3B. "The first chip component 3A and the second chip component 3B have the same distance H1 between the reference plane 920 and the second main surface 312 of the substrate 31 in the thickness direction D1 of the mounting substrate 9" is not limited to being exactly the same, and based on the distance H1 with respect to the first chip component 3A mounted in the bonding region 923 by the bump 26, a distance between the reference plane 920 and the second main surface 312 of the substrate 31 of the second chip component 3B may be within the range of the distance H1 ±about 15%, preferably within the range of the distance H1 ±about 10%, and more preferably within the range of the distance H1 ±about 5%.

In the radio-frequency module 1 according to the embodiment, the first chip component 3A is the first switch 4 for switching signal paths, and the second chip component 3B is the second switch 5 for switching signal paths. Regarding the chip components 3 (for example, the third switch 6, the fourth switch 7, and the low-noise amplifier 21) other than the two chip components 3 (the first chip component 3A and the second chip component 3B), a distance between the reference plane 920 and the second main surface 312 of the substrate 31 in the thickness direction D1 of the mounting substrate 9 is not limited to being the same as the distance H1 and may be shorter than the distance H1. That is, regarding the chip components 3 (for example, the third switch 6, the fourth switch 7, and the low-noise amplifier 21) other than the first chip component 3A and the second chip component 3B, it is not essential that the second main surface 312 of the substrate 31 is exposed.

3.2. Communication Device

The communication device 300 according to the embodiment includes the signal processing circuit 301 and the radio-frequency module 1. The signal processing circuit 301 performs signal processing on a reception signal from the antenna 310 and a transmission signal to the antenna 310. The radio-frequency module 1 transmits a reception signal and a transmission signal between the antenna 310 and the signal processing circuit 301.

Since the communication device 300 according to the embodiment includes the radio-frequency module 1, it is possible to reduce the height of the radio-frequency module 1 in the thickness direction D1 of the mounting substrate 9. In addition, the communication device 300 according to the embodiment can reduce the height of the radio-frequency module 1 and the above-described circuit board. In this case, the plurality of electronic components configuring the signal processing circuit 301 may be mounted on, for example, the above-described circuit board, or may be mounted on a circuit board (second circuit board) different from the circuit board (first circuit board) on which the radio-frequency module 1 is mounted.

4. Modification of Radio-frequency Module 4.1. Modification 1

Figure 4:
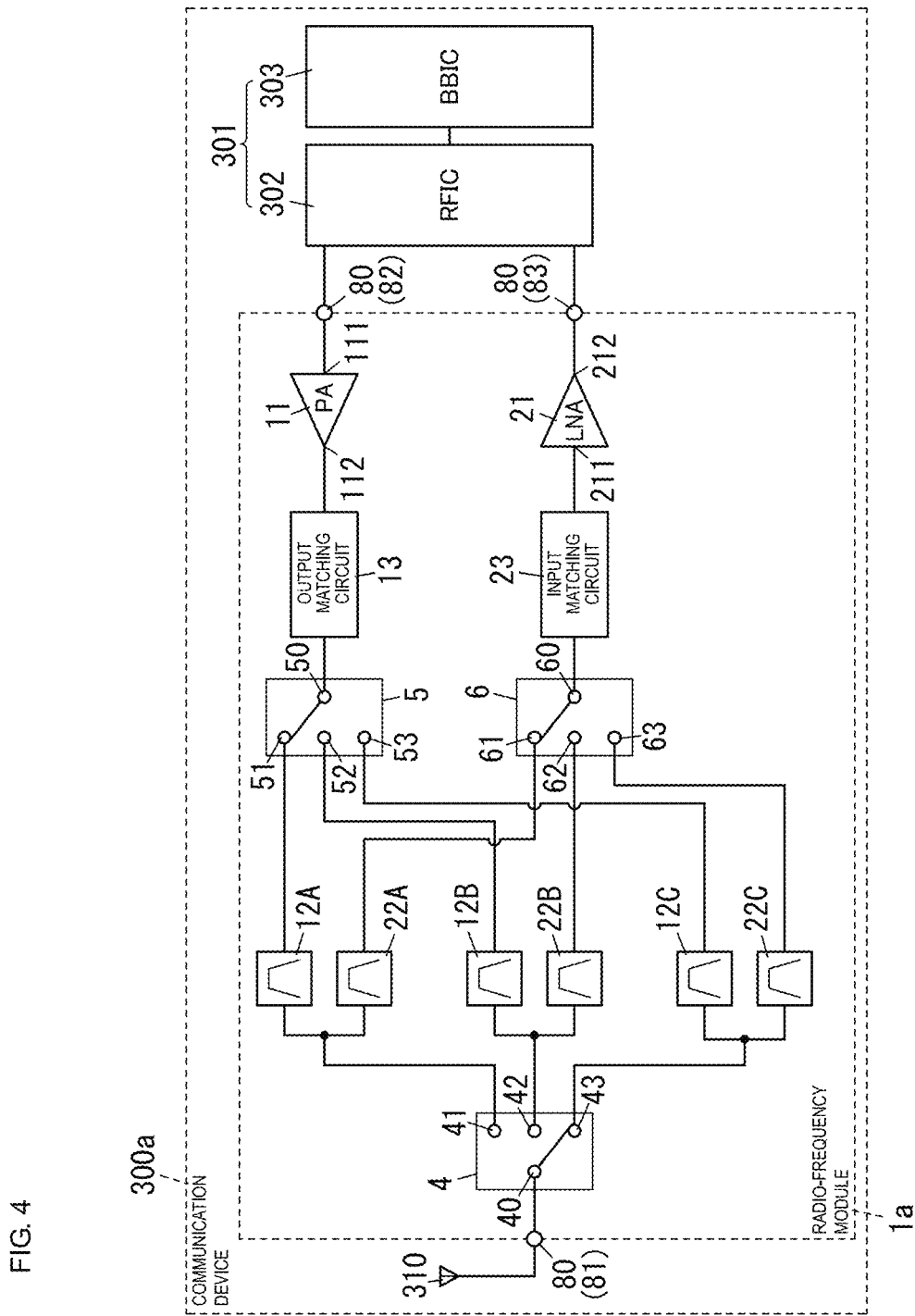
FIG. 4 is a circuit configuration diagram of a communication device including a radio-frequency module according to Modification 1 of the embodiment.
Figure 5:
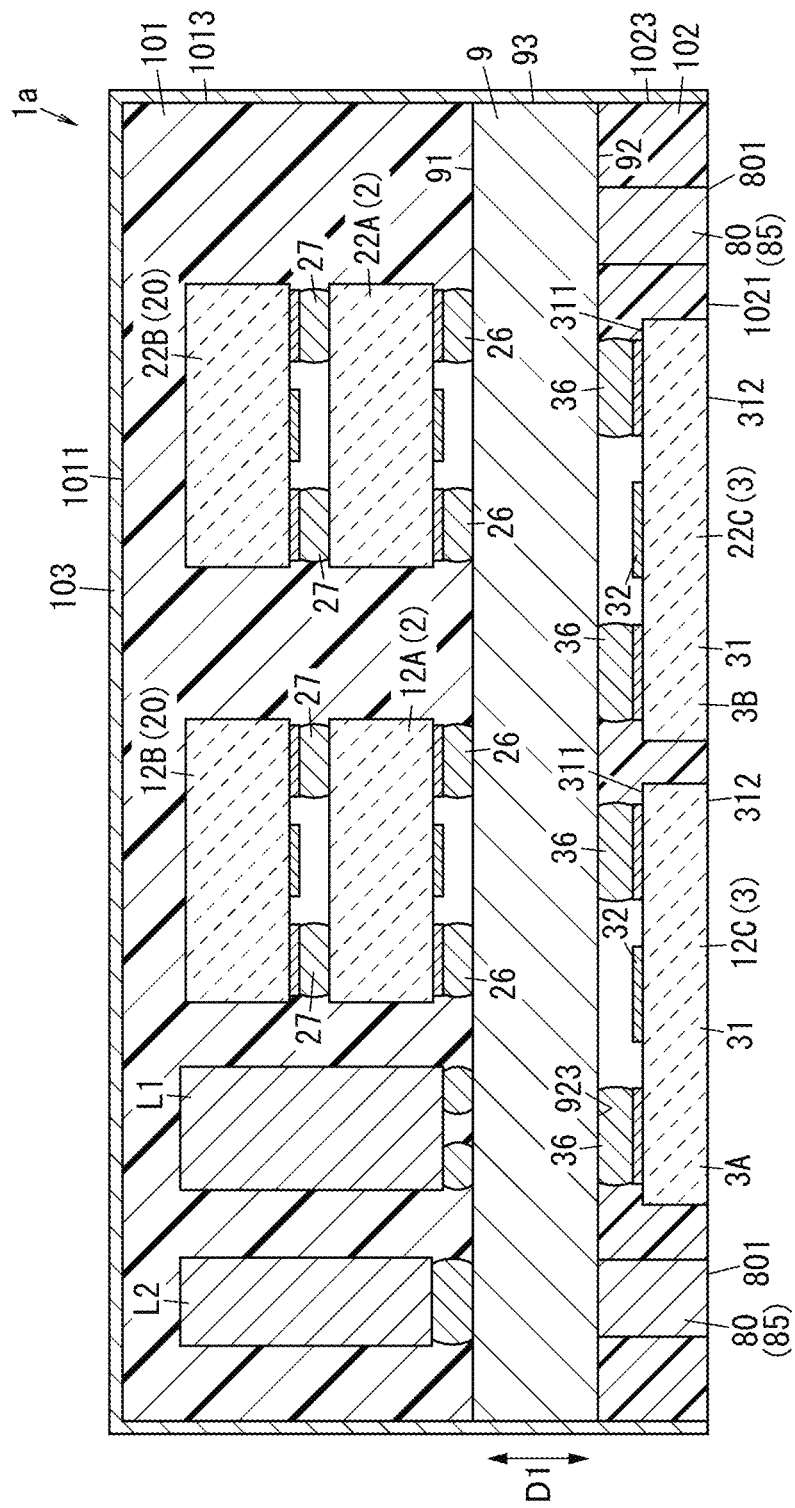
FIG. 5 is a cross-sectional view of the above radio-frequency module.

A radio-frequency module 1a and a communication device 300a according to Modification 1 of the embodiment will be described with reference to FIGS. 4 and 5. Regarding the radio-frequency module 1a and the communication device 300a according to Modification 1, the same constituent elements as those of the radio-frequency module 1 and the communication device 300 according to the embodiment are denoted by the same reference numerals, and the description thereof will be omitted.

The radio-frequency module 1a according to Modification 1 is different from the radio-frequency module 1 according to the embodiment in that a transmission filter 12C and a reception filter 22C are provided instead of the transmission/reception filter 24 and the fourth switch 7 in the radio-frequency module 1 according to the embodiment. The transmission filter 12C is, for example, a filter whose pass band is a transmission band of the third communication band. The reception filter 22C is, for example, a filter whose pass band is a reception band of the third communication band.

Each of the transmission filter 12C and the reception filter 22C is, for example, a chip component. In a plan view from the thickness direction D1 of the mounting substrate 9, an outer peripheral shape of each of the transmission filter 12C and the reception filter 22C is a substantially quadrilateral shape.

Each of the transmission filter 12C and the reception filter 22C is, for example, a ladder filter, and includes a plurality of (for example, four) series arm resonators and a plurality of (for example, three) parallel arm resonators. Each of the transmission filter 12C and the reception filter 22C is, for example, an acoustic wave filter, similarly to the transmission filters 12A and 12B and the reception filters 22A and 22B, and each of a plurality of series arm resonators and a plurality of parallel arm resonators is formed of an acoustic wave resonator. The acoustic wave filter is, for example, a surface acoustic wave filter using a surface acoustic wave. In the surface acoustic wave filter, each of the plurality of series arm resonators and the plurality of parallel arm resonators is, for example, a SAW resonator. Here, the surface acoustic wave filter is, for example, a chip component including a substrate having a first main surface and a second main surface, and a circuit portion formed on the first main surface side of the substrate. The substrate is a piezoelectric substrate. The piezoelectric substrate is, for example, a lithium tantalate substrate, a lithium niobate substrate, or the like. The circuit portion includes a plurality of IDT electrodes corresponding one to one to the plurality of series arm resonators and a plurality of IDT electrodes corresponding one to one to the plurality of parallel arm resonators.

The transmission filter 12C and the reception filter 22C are mounted on the second main surface 92 of the mounting substrate 9. The transmission filter 12C and the reception filter 22C are arranged such that the first main surface of the first main surface and the second main surface of the substrate is on the mounting substrate 9 side.

In the radio-frequency module 1a according to Modification 1, similarly to the radio-frequency module 1 according to the embodiment, each of the first chip component 3A and the second chip component 3B mounted on the second main surface 92 of the mounting substrate 9 includes the substrate 31 and the circuit portion 32. The substrate 31 has the first main surface 311 and the second main surface 312 facing each other. The circuit portion 32 is formed on the first main surface 311 side of the substrate 31. In the radio-frequency module 1, the second main surface 312 of the substrate 31 in each of the first chip component 3A and the second chip component 3B is exposed. In the radio-frequency module 1a according to Modification 1, the transmission filter 12C configures a first filter included in the first chip component 3A, and the reception filter 22C configures a second filter included in the second chip component 3B. The first filter allows the first radio-frequency signal (here, the radio-frequency signal in the transmission band of the third band) to pass therethrough. The second filter allows the second radio-frequency signal (here, the radio-frequency signal in the reception band of the third band) to pass therethrough. In the radio-frequency module 1a according to Modification 1, the material of the substrate 31 in the first chip component 3A is the same as the material of the substrate 31 in the second chip component 3B. For example, in a case where the substrate 31 is a lithium tantalate substrate, the main components of the substrate 31 are lithium, tantalum, and oxygen, and even in a case where impurities are added to lithium tantalate, the main components do not contain impurities. Similarly, in a case where the substrate 31 is a lithium niobate substrate, the main components of the substrate 31 are lithium, niobium, and oxygen, and even in a case where impurities are added to lithium niobate, the main components do not contain impurities.

In the radio-frequency module 1a according to Modification 1, since the second main surface 312 of the substrate 31 in each of the first chip component 3A and the second chip component 3B is exposed, it is possible to reduce the height, similarly to the radio-frequency module 1 according to Embodiment 1.

In addition, since the communication device 300a according to Modification 1 of the embodiment includes the radio-frequency module 1a, it is possible to reduce the height of the radio-frequency module 1 in the thickness direction D1 of the mounting substrate 9.

4.2. Modification 2

Figure 6:
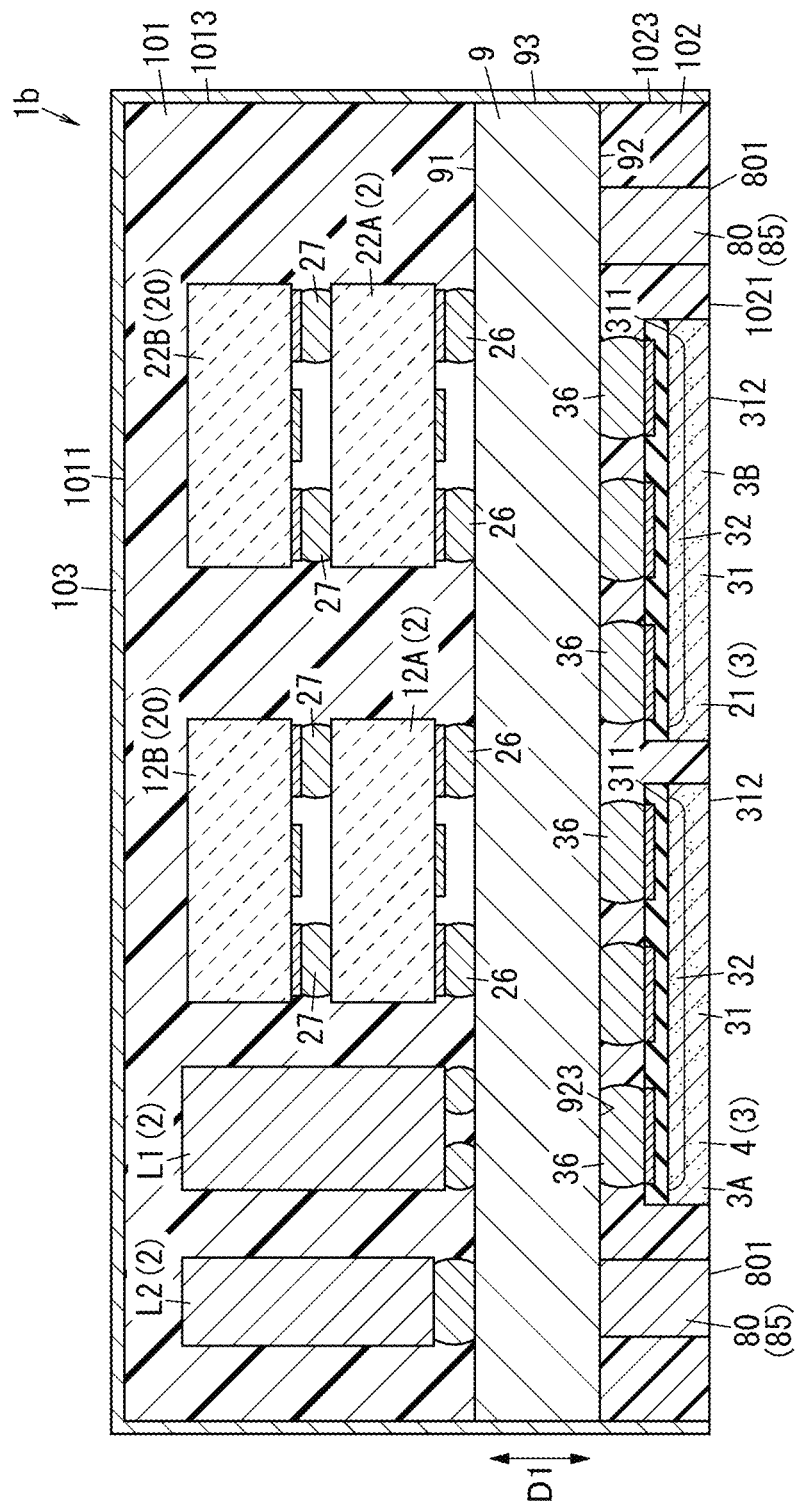
FIG. 6 is a cross-sectional view of a radio-frequency module according to Modification 2 of the embodiment.

A radio-frequency module 1b according to Modification 2 of the embodiment will be described with reference to FIG. 6. Regarding the radio-frequency module 1b according to Modification 2, the same constituent elements as those of the radio-frequency module 1 according to the embodiment are denoted by the same reference numerals, and the description thereof will be omitted.

In the radio-frequency module 1b according to Modification 2, the first switch 4 configures the first chip component 3A, and the low-noise amplifier 21 configures the second chip component 3B. In the radio-frequency module 1b according to Modification 2, the first switch 4 configures a switch for switching signal paths. The low-noise amplifier 21 is provided in the signal path of the reception signal.

In the radio-frequency module 1b according to Modification 2, similarly to the radio-frequency module 1 according to Embodiment 1, since the second main surface 312 of the substrate 31 in each of the first chip component 3A and the second chip component 3B is exposed, it is possible to reduce the height.

4.3. Modification 3

Figure 7:
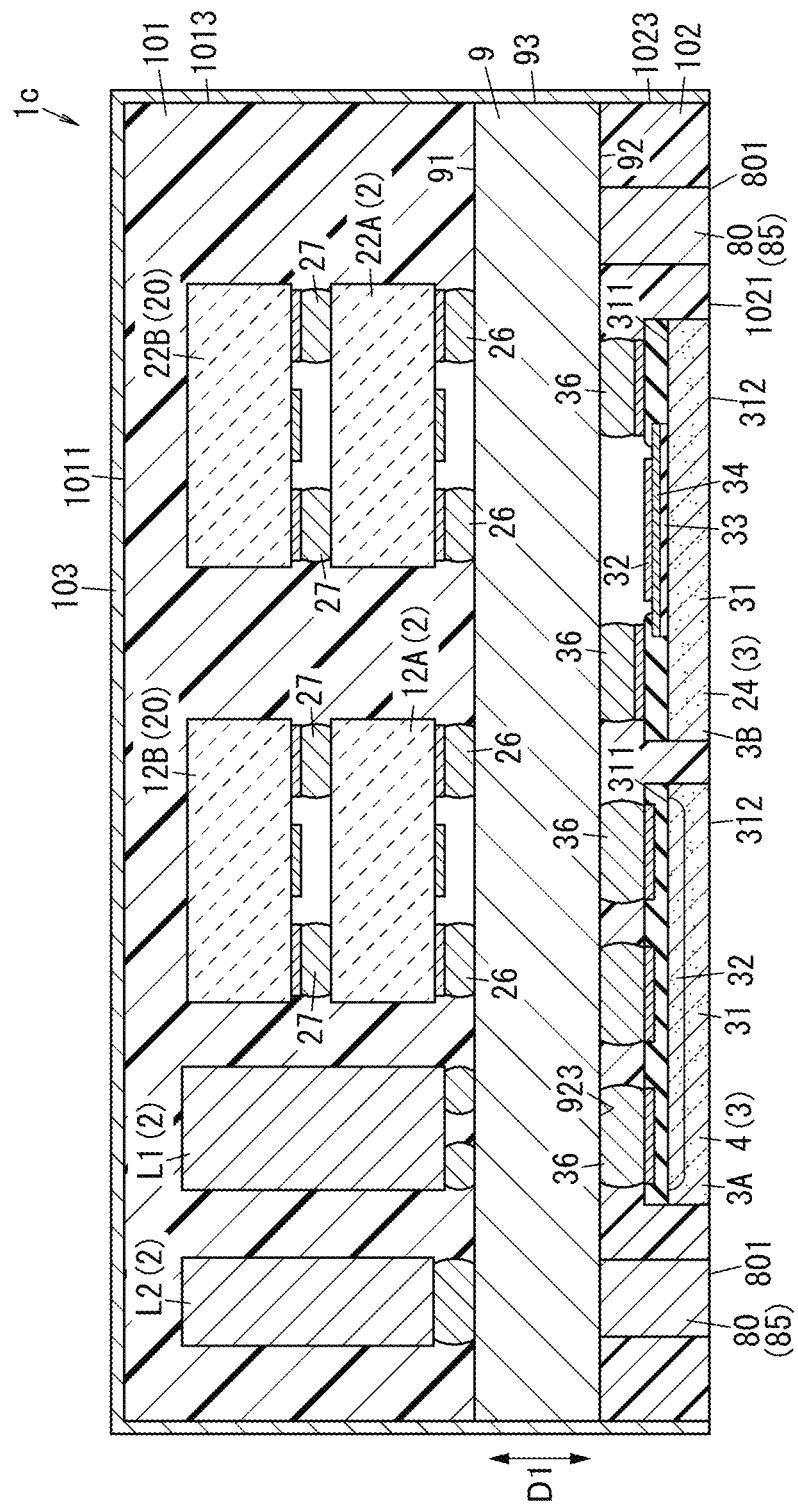
FIG. 7 is a cross-sectional view of a radio-frequency module according to Modification 3 of the embodiment.

A radio-frequency module 1c according to Modification 3 of the embodiment will be described with reference to FIG. 7. Regarding the radio-frequency module 1c according to Modification 3, the same constituent elements as those of the radio-frequency module 1 according to the embodiment are denoted by the same reference numerals, and the description thereof will be omitted.

In the radio-frequency module 1c according to Modification 3, the first switch 4 configures the first chip component 3A, and the transmission/reception filter 24 configures the second chip component 3B. In the radio-frequency module 1c according to Modification 3, the first switch 4 configures a switch for switching signal paths. In the radio-frequency module 1c according to Modification 3, the transmission/reception filter 24 configures a surface acoustic wave filter provided in the signal path.

The chip component 3 configuring a surface acoustic wave filter includes the substrate 31 and the circuit portion 32. The substrate 31 has the first main surface 311 and the second main surface 312. The circuit portion 32 includes a plurality of first IDT electrodes corresponding one to one to the series arm resonators and a plurality of second IDT electrodes corresponding one to one to the parallel arm resonators. In the transmission/reception filter 24, the substrate 31 is, for example, a silicon substrate. The transmission/reception filter 24 includes a low acoustic velocity film 33 provided on the first main surface 311 of the substrate 31 and a piezoelectric layer 34 provided on the low acoustic velocity film 33. The plurality of first IDT electrodes and the plurality of second IDT electrodes are provided on the piezoelectric layer 34. The low acoustic velocity film 33 is provided directly or indirectly on the substrate 31. The piezoelectric layer 34 is directly or indirectly provided on the low acoustic velocity film 33. In the low acoustic velocity film 33, an acoustic velocity of a bulk wave propagating through the low acoustic velocity film is lower than an acoustic velocity of a bulk wave propagating through the piezoelectric layer 34. In the substrate 31, an acoustic velocity of a bulk wave propagating through the substrate 31 is higher than an acoustic velocity of an acoustic wave propagating through the piezoelectric layer 34. A material of the piezoelectric layer 34 is, for example, lithium tantalate. A material of the low acoustic velocity film 33 is, for example, silicon oxide. A thickness of the piezoelectric layer 34 is, for example, equal to or less than about 3.5λ, where λ is a wavelength of an acoustic wave determined by an electrode finger period of the IDT electrode. A thickness of the low acoustic velocity film 33 is, for example, equal to or less than about 2.0λ.

The piezoelectric layer 34 may be formed of, for example, any one of lithium tantalate, lithium niobate, zinc oxide, aluminum nitride, and lead zirconate titanate. The low acoustic velocity film 33 may contain at least one material selected from the group consisting of silicon oxide, glass, silicon oxynitride, tantalum oxide, and a compound obtained by adding fluorine, carbon, or boron to silicon oxide. The substrate may contain at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

The surface acoustic wave filter may include, for example, an adhesion layer interposed between the low acoustic velocity film 33 and the piezoelectric layer 34. The adhesion layer is made of, for example, resin (epoxy resin, polyimide resin). The surface acoustic wave filter may include a dielectric film between the low acoustic velocity film 33 and the piezoelectric layer 34, on the piezoelectric layer 34, or under the low acoustic velocity film 33.

The surface acoustic wave filter may include, for example, a high acoustic velocity film interposed between the substrate 31 and the low acoustic velocity film 33. Here, the high acoustic velocity film is directly or indirectly provided on the substrate 31. The low acoustic velocity film 33 is provided directly or indirectly on the high acoustic velocity film. The piezoelectric layer 34 is provided directly or indirectly on the low acoustic velocity film 33. In the high acoustic velocity film, an acoustic velocity of a bulk wave propagating through the high-acoustic-velocity film is higher than an acoustic velocity of an acoustic wave propagating through the piezoelectric layer 34. In the low acoustic velocity film 33, the acoustic velocity of the bulk wave propagating through the low acoustic velocity film 33 is lower than the acoustic velocity of the bulk wave propagating through the piezoelectric layer 34.

The high acoustic velocity film is made of diamond-like carbon, aluminum nitride, aluminum oxide, silicon carbide, silicon nitride, silicon, sapphire, lithium tantalate, lithium niobate, a piezoelectric material such as quartz, various ceramics such as alumina, zirconia, cordierite, mullite, steatite, forsterite and the like, magnesia, diamond, a material containing each of the above-described materials as a main component, or a material containing a mixture of each of the above-described materials as a main component.

Regarding a thickness of the high acoustic velocity film, since the high acoustic velocity film has a function of confining an acoustic wave in the piezoelectric layer 34 and the low acoustic velocity film 33, the thickness of the high acoustic velocity film is preferably as large as possible.

The surface acoustic wave filter may further include, for example, a spacer layer and a cover member. The spacer layer and the cover member are provided on the first main surface 311 side of the substrate 31. The spacer layer surrounds the plurality of IDT electrodes in a plan view from the thickness direction D1 of the mounting substrate 9. The spacer layer has a substantially frame shape (substantially rectangular frame shape) in a plan view from the thickness direction D1 of the mounting substrate 9. The spacer layer has electrical insulation properties. A material of the spacer layer is, for example, a synthetic resin such as an epoxy resin, polyimide or the like. The cover member has a substantially flat plate shape. In a plan view from the thickness direction D1 of the mounting substrate 9, the cover member has a substantially rectangular shape, but is not limited thereto and may have, for example, a substantially square shape. In the surface acoustic wave filter, the outer size of the cover member, the outer size of the spacer layer, and the outer size of the cover member are substantially the same in a plan view from the thickness direction D1 of the mounting substrate 9. The cover member is arranged on the spacer layer so as to face the substrate 31 in the thickness direction D1 of the mounting substrate 9. The cover member overlaps the plurality of IDT electrodes in the thickness direction D1 of the mounting substrate 9 and is apart from the plurality of IDT electrodes in the thickness direction D1 of the mounting substrate 9. The cover member has electrical insulation properties. The material of the cover member is, for example, a synthetic resin such as an epoxy resin, polyimide or the like. The surface acoustic wave filter has a space surrounded by the substrate 31, the spacer layer, and the cover member. In the surface acoustic wave filter, the space contains a gas. The gas is, for example, air, an inert gas (for example, nitrogen gas), or the like. A plurality of terminals in the surface acoustic wave filter is exposed from the cover member. Each of the plurality of terminals is, for example, a bump. Each bump is, for example, a solder bump. Each bump is not limited to the solder bump and may be, for example, a gold bump.

In the radio-frequency module 1c according to Modification 3, similarly to the radio-frequency module 1 according to Embodiment 1, since the second main surface 312 of the substrate 31 in each of the first chip component 3A and the second chip component 3B is exposed, it is possible to reduce the height.

4.4. Modification 4

A radio-frequency module 1d and a communication device 300d according to Modification 4 of the embodiment will be described with reference to FIGS. 8 and 9. Regarding the radio-frequency module 1d and the communication device 300d according to Modification 4, the same constituent elements as those of the radio-frequency module 1 and the communication device 300 according to the embodiment are denoted by the same reference numerals, and the description thereof will be omitted.

The radio-frequency module 1d according to Modification 4 includes one transmission filter 12 and one reception filter 22 instead of the two transmission filters 12A and 12B and the two reception filters 22A and 22B of the radio-frequency module 1 according to the embodiment. The radio-frequency module 1d according to Modification 4 does not include the transmission/reception filter 24 of the radio-frequency module 1 according to the embodiment.

Figure 8:
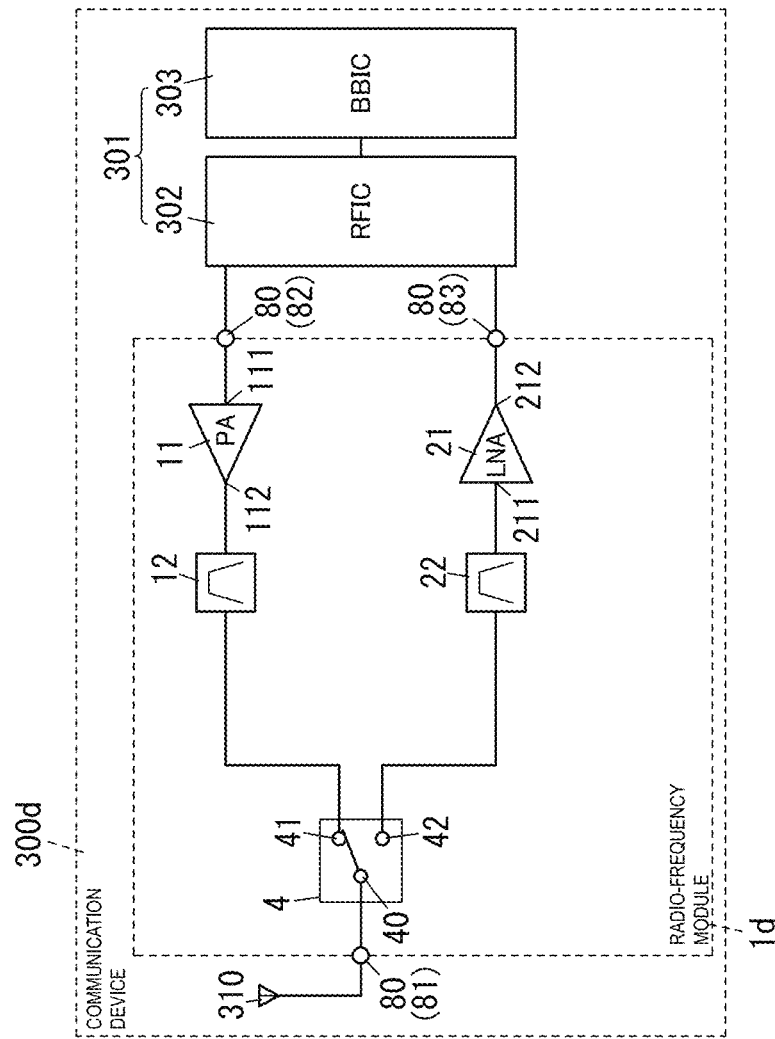
FIG. 8 is a circuit configuration diagram of a communication device including a radio-frequency module according to Modification 4 of the embodiment.
Figure 9:
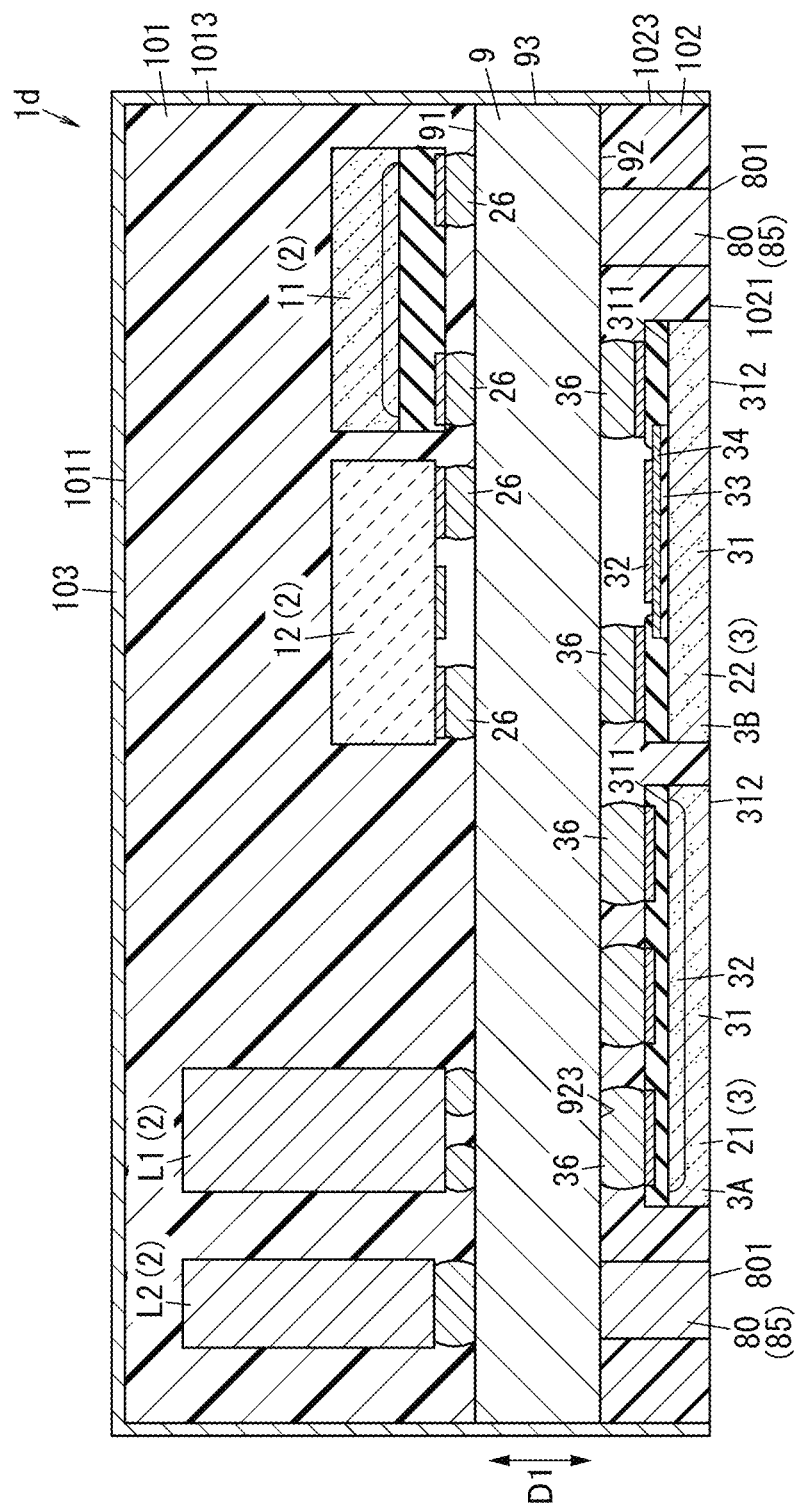
FIG. 9 is a cross-sectional view of the above radio-frequency module.

In the radio-frequency module 1d according to Modification 4, as illustrated in FIG. 8, the output terminal 112 of the power amplifier 11 is connected to the selection terminal 41 of the first switch 4 via the transmission filter 12. In the radio-frequency module 1d according to Modification 4, the input terminal 211 of the low-noise amplifier 21 is connected to the selection terminal 42 of the first switch 4 via the reception filter 22. The low-noise amplifier 21 is provided in a signal path for a reception signal. The reception filter 22 is provided in a signal path for a reception signal.

In the radio-frequency module 1d according to Modification 4, the plurality of electronic components 2 includes the power amplifier 11 and the transmission filter 12. The power amplifier 11 is provided in a signal path for a transmission signal. The transmission filter 12 is provided in a signal path for a transmission signal.

In the radio-frequency module 1d according to Modification 4, the low-noise amplifier 21 configures the first chip component 3A, and the reception filter 22 configures the second chip component 3B. In the radio-frequency module 1d according to Modification 4, the reception filter 22 is a surface acoustic wave filter similar to that of Modification 3, includes the substrate 31 and the circuit portion 32, and further includes the low acoustic velocity film 33 and the piezoelectric layer 34.

In the radio-frequency module 1d according to Modification 4, similarly to the radio-frequency module 1 according to Embodiment 1, since the second main surface 312 of the substrate 31 in each of the first chip component 3A and the second chip component 3B is exposed, it is possible to reduce the height.

In the radio-frequency module 1d according to Modification 4, the power amplifier 11 and the transmission filter 12 are mounted on the first main surface 91 of the mounting substrate 9, and the low-noise amplifier 21 and the reception filter 22 are mounted on the second main surface 92 of the mounting substrate 9. Accordingly, in the radio-frequency module 1d according to Modification 4, the mounting substrate 9 includes the ground layer located between the transmission path and the reception path, whereby it is possible to improve isolation between the transmission path and the reception path. In the radio-frequency module 1d according to Modification 4, the power amplifier 11 and the low-noise amplifier 21 do not overlap each other in a plan view from the thickness direction D1 of the mounting substrate 9. Thus, isolation between the power amplifier 11 and the low-noise amplifier 21 can be improved.

In addition, since the communication device 300d according to Modification 4 includes the radio-frequency module 1d, it is possible to reduce the height of the radio-frequency module 1d in the thickness direction D1 of the mounting substrate 9.

4.5. Modification 5

Figure 10:
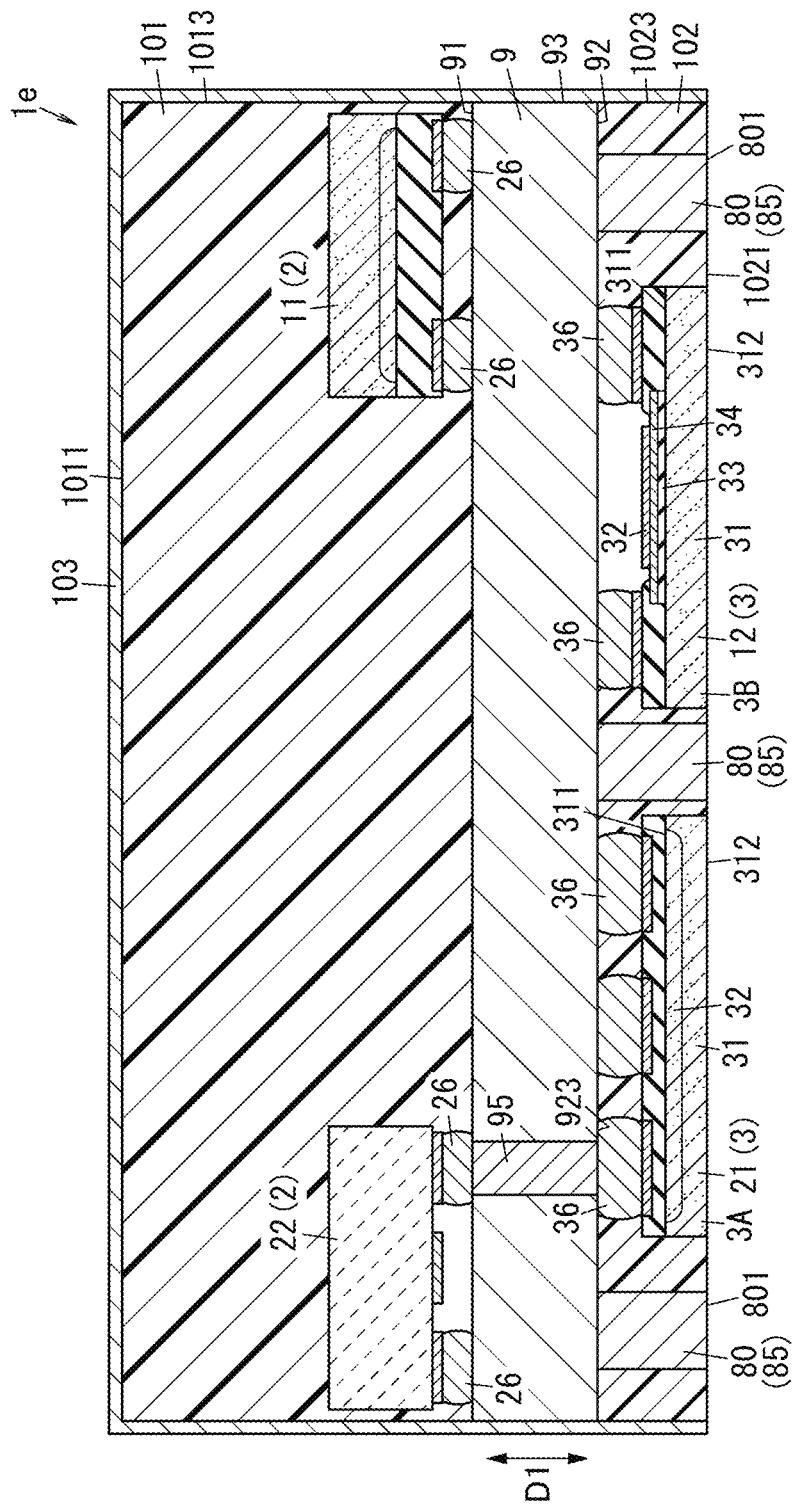
FIG. 10 is a cross-sectional view of a radio-frequency module according to Modification 5 of the embodiment.

A radio-frequency module 1e according to Modification 5 of the embodiment will be described with reference to FIG. 10. Regarding the radio-frequency module 1e according to Modification 5, the same constituent elements as those of the radio-frequency module 1d according to Modification 4 of the embodiment are denoted by the same reference numerals, and the description thereof will be omitted.

In the radio-frequency module 1e according to Modification 5, the plurality of electronic components 2 includes the power amplifier 11 and the reception filter 22. In the radio-frequency module 1e according to Modification 5, the low-noise amplifier 21 configures the first chip component 3A, and the transmission filter 12 configures the second chip component 3B. In the radio-frequency module 1e according to Modification 5, the transmission filter 12 is a surface acoustic wave filter similar to that of Modification 3, includes the substrate 31 and the circuit portion 32, and further includes the low acoustic velocity film 33 and the piezoelectric layer 34.

In the radio-frequency module 1e according to Modification 5, similarly to the radio-frequency module 1d according to Modification 4, since the second main surface 312 of the substrate 31 in each of the first chip component 3A and the second chip component 3B is exposed, it is possible to reduce the height.

In the radio-frequency module 1e according to Modification 5, the mounting substrate 9 includes a wiring portion 95 that electrically connects the reception filter 22 and the low-noise amplifier 21. The wiring portion 95 penetrates through the mounting substrate 9 in the thickness direction D1 thereof. Thus, in the radio-frequency module 1e according to Modification 5, a parasitic capacitance between the wiring portion 95 and the ground layer of the mounting substrate 9 can be reduced as compared with the case where the reception filter 22 and the low-noise amplifier 21 are mounted on the second main surface 92 of the mounting substrate 9 and are connected by a wiring portion arranged along the second main surface 92 of the mounting substrate 9. As a result, the radio-frequency module 1e according to Modification 5 can reduce NF (Noise Figure) of the low-noise amplifier 21 as compared with the radio-frequency module 1d according to Modification 4.

In the radio-frequency module 1e according to Modification 5, the ground terminal 85 is positioned between the second chip component 3B (the transmission filter 12) provided in the signal path for the transmission signal and the first chip component 3A (the low-noise amplifier 21 in this case) provided in the signal path for the reception signal. Thus, the radio-frequency module 1e according to Modification 5 can improve isolation between the second chip component 3B (the transmission filter 12) provided in the signal path for the transmission signal and the first chip component 3A (the low-noise amplifier 21) provided in the signal path for the reception signal.

4.6. Modification 6

Figure 11:
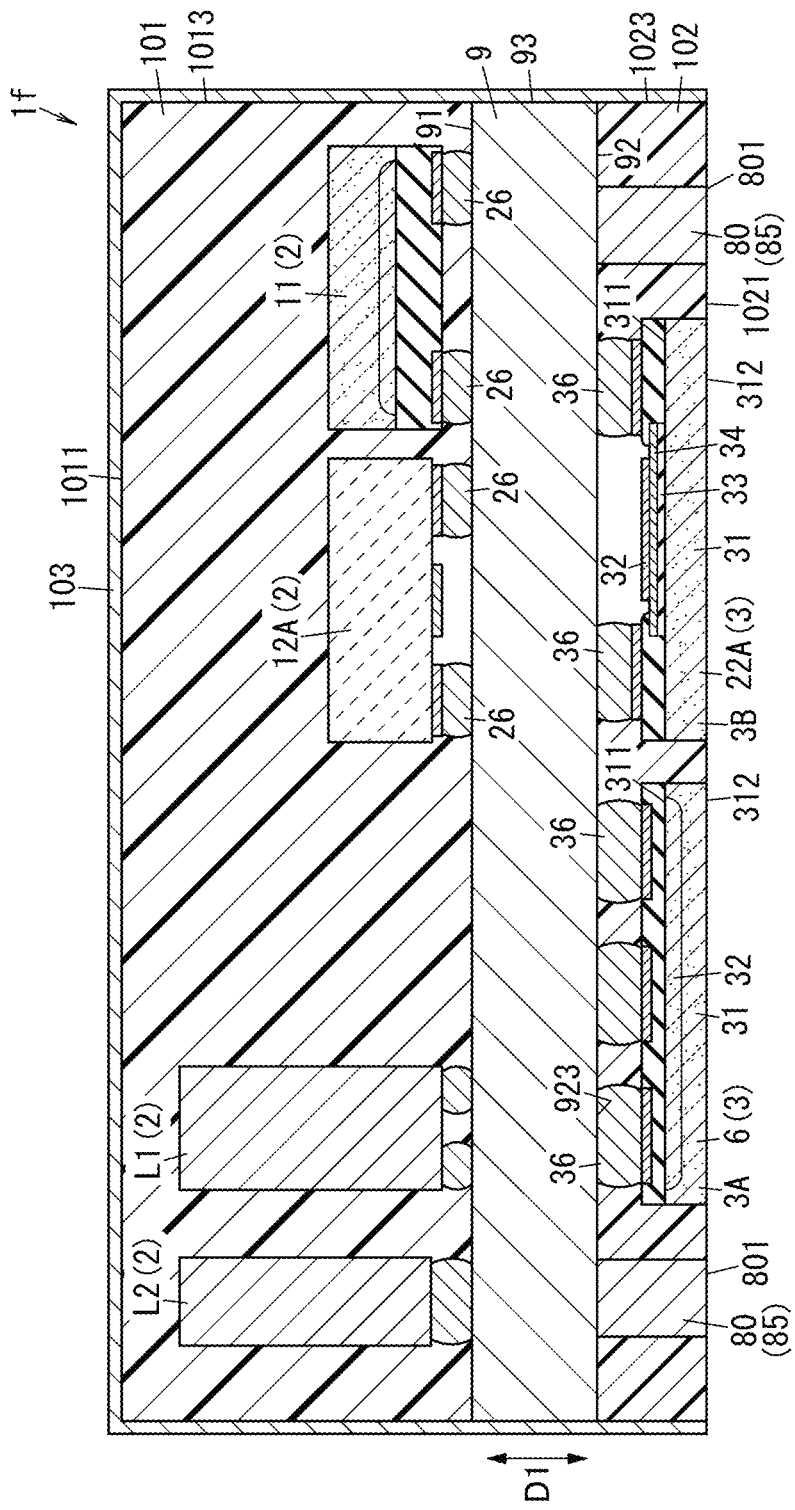
FIG. 11 is a cross-sectional view of a radio-frequency module according to Modification 6 of the embodiment.

A radio-frequency module 1f according to Modification 6 of the embodiment will be described with reference to FIG. 11. Regarding the radio-frequency module 1f according to Modification 6, the same constituent elements as those of the radio-frequency module 1a according to Modification 1 of the embodiment are denoted by the same reference numerals, and the description thereof will be omitted.

In the radio-frequency module 1f according to Modification 6, a switch (third switch 6) provided in the signal path for the reception signal configures the first chip component 3A, and the reception filter 22A provided in the signal path for the reception signal configures the second chip component 3B. In the radio-frequency module 1f according to Modification 6, the reception filter 22A is a surface acoustic wave filter similar to that of Modification 3, includes the substrate 31 and the circuit portion 32, and further includes the low acoustic velocity film 33 and the piezoelectric layer 34.

The plurality of electronic components 2 includes the power amplifier 11 provided in the signal path for the transmission signal and a filter (transmission filter 12A) provided in the signal path for the transmission signal.

In the radio-frequency module 1f according to Modification 6, similarly to the radio-frequency module 1 according to Embodiment 1, since the second main surface 312 of the substrate 31 in each of the first chip component 3A and the second chip component 3B is exposed, it is possible to reduce the height.

4.7. Modification 7

Figure 12:
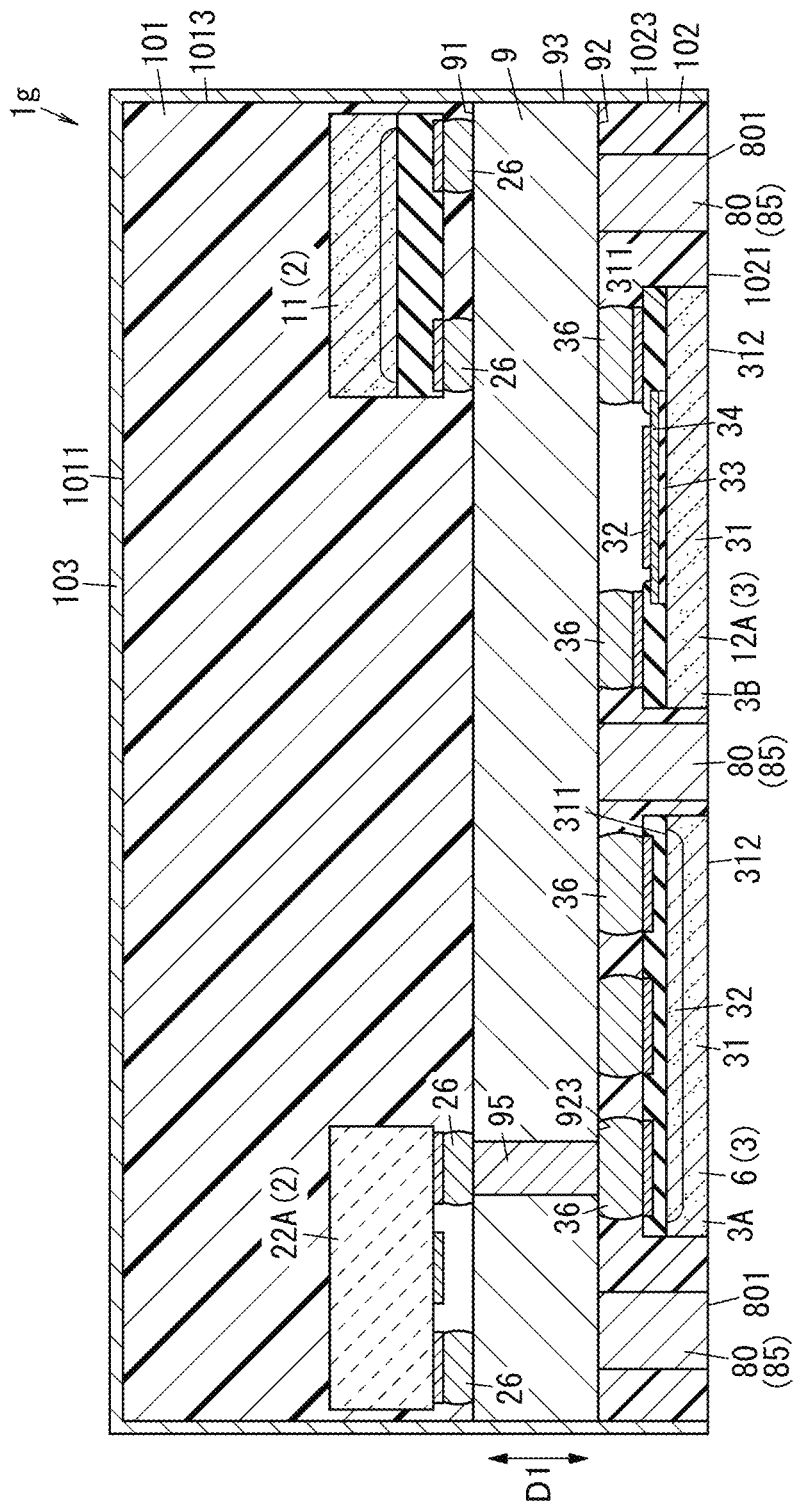
FIG. 12 is a cross-sectional view of a radio-frequency module according to Modification 7 of the embodiment.

A radio-frequency module 1g according to Modification 7 of the embodiment will be described with reference to FIG. 12. Regarding the radio-frequency module 1g according to Modification 7, the same constituent elements as those of the radio-frequency module 1a according to Modification 1 of the embodiment are denoted by the same reference numerals, and the description thereof will be omitted.

In the radio-frequency module 1g according to Modification 7, the switch (third switch 6) provided in the signal path for the reception signal configures the first chip component 3A, and the transmission filter 12A provided in the signal path for the transmission signal configures the second chip component 3B.

The plurality of electronic components 2 includes the power amplifier 11 provided in the signal path for a transmission signal and the reception filter 22A provided in the signal path for the reception signal.

In the radio-frequency module 1g according to Modification 7, similarly to the radio-frequency module 1 according to Embodiment 1, since the second main surface 312 of the substrate 31 in each of the first chip component 3A and the second chip component 3B is exposed, it is possible to reduce the height.

The above-described embodiment is merely one of various embodiments of the present disclosure. The above-described embodiment can be variously modified according to design or the like as long as the aspects of the present disclosure can be achieved.

For example, the present disclosure is not limited to the case where the entire region of the second main surface 312 of the substrate 31 in each of the first chip component 3A and the second chip component 3B is exposed, and only a part of the second main surface 312 may be exposed.

The number of the electronic components 2 mounted on the first main surface 91 of the mounting substrate 9 is not limited to two or more, and may be one.

The mounting substrate 9 is not limited to a printed wiring board or an LTCC substrate, and may be, for example, an HTCC (High Temperature Co-fired Ceramics) substrate, a component-embedded substrate, or the like.

The first switch 4, the second switch 5, the third switch 6, the fourth switch 7, and the low-noise amplifier 21 may be configured by separate chip components (IC chips) as in the high frequency module 1 of the embodiment, or may be integrated into one chip in an arbitrary combination.

Each of the radio-frequency modules 1 to 1g may include a controller (power amplifier controller) that controls the power amplifier 11 based on a control signal from the signal processing circuit 301. The controller is, for example, a chip component (IC chip) including a substrate having a first main surface and a second main surface facing each other, and a control function portion formed on the first main surface side of the substrate. Here, the substrate is, for example, a silicon substrate.

The substrate of the power amplifier 11 is not limited to the gallium arsenide substrate, and may be, for example, a silicon substrate. In this case, the transistor included in the power amplifier 11 is not the HBT but a bipolar transistor.

The number of selection terminals in each of the first switch 4, the second switch 5, the third switch 6, and the fourth switch 7 may be plural, and is not limited to the exemplified number.

The filter such as the transmission filters 12, 12A, 12B, and 12C is not limited to the ladder filter and may be, for example, a longitudinally coupled resonator-type surface acoustic wave filter.

In addition, the above-described filter is an acoustic wave filter using a surface acoustic wave, but is not limited thereto, and may be, for example, the acoustic wave filter using boundary acoustic waves, a plate wave, or the like.

In the acoustic wave filter, each of the plurality of series arm resonators and the plurality of parallel arm resonators is not limited to the SAW resonator, and may be, for example, a BAW (Bulk Acoustic Wave) resonator.

The filter may be an LC filter. In the case where the filter is formed of the acoustic wave filter, attenuation characteristics in the vicinity of the pass band can be improved as compared with the case where the filter is formed of the LC filter. Further, in the case where the filter is formed of the acoustic wave filter, F (reflection coefficient) in the mid-band can be made larger than the case where the filter is formed of the LC filter.

The output matching circuit 13 may be, for example, a chip component (IC chip) including a substrate having a first main surface and a second main surface facing each other, and a circuit portion including a plurality of inductors and a plurality of capacitors formed on the first main surface side of the substrate. In this case, the IC chip may be an IPD (Integrated Passive Device). The substrate is, for example, a silicon substrate. In the case of the IPD, for example, the output matching circuit 13 is flip-chip mounted on the first main surface 91 of the mounting substrate 9 such that the first main surface of the first main surface and the second main surface of the substrate is on the first main surface 91 side of the mounting substrate 9.

A tip portion of each of the plurality of external connection terminals 80 may include, for example, a gold plating layer.

Each of the plurality of external connection terminals 80 is not limited to a columnar electrode, and may be, for example, a bump. Here, the bump is, for example, spherical. In this case, each of the plurality of external connection terminals 80 is a ball bump. A material of the ball bump is, for example, gold, copper, solder, or the like.

The circuit configuration of the radio-frequency modules 1 to 1e is not limited to the example described above. Each of the radio-frequency modules 1 to 1e may include, for example, a MIMO (Multi Input Multi Output) compatible radio-frequency front-end circuit as a circuit configuration.

The communication device 300 according to the embodiment may include any one of the radio-frequency modules 1a, 1b, 1c, 1d, and 1e instead of the radio-frequency module 1.

Aspects

In this specification, the following aspects are disclosed.

A radio-frequency module (1; 1a; 1b; 1c; 1d; 1e; 1f; 1g) according to a first aspect includes a mounting substrate (9), an electronic component (2), a first chip component (3A), and a second chip component (3B). The mounting substrate (9) has a first main surface (91) and a second main surface (92) facing each other. The electronic component (2) is mounted on the first main surface (91) of the mounting substrate (9). The first chip component (3A) and the second chip component (3B) are mounted on the second main surface (92) of the mounting substrate (9). Each of the first chip component (3A) and the second chip component (3B) includes a substrate (31) and a circuit portion (32). The substrate (31) has a first main surface (311) and a second main surface (312) facing each other. The circuit portion (32) is formed on the first main surface (311) side of the substrate (31). In the radio-frequency module (1; 1a; 1b; 1c; 1d; 1e; 1f; 1g), at least a part of the second main surface (312) of the substrate (31) in each of the first chip component (3A) and the second chip component (3B) is exposed. A material of the substrate (31) in the first chip component (3A) is the same as a material of the substrate (31) in the second chip component (3B).

The radio-frequency module (1; 1a; 1b; 1c; 1d; 1e; 1f; 1g) according to the first aspect can be reduced in height in a thickness direction (D1) of the mounting substrate (9).

A radio-frequency module (1; 1a; 1b; 1c; 1d; 1e; 1f; 1g) according to a second aspect includes a mounting substrate (9), an electronic component (2), a first chip component (3A), and a second chip component (3B). The mounting substrate (9) has a first main surface (91) and a second main surface (92) facing each other. The electronic component (2) is mounted on the first main surface (91) of the mounting substrate (9). The first chip component (3A) and the second chip component (3B) are mounted on the second main surface (92) of the mounting substrate (9). Each of the first chip component (3A) and the second chip component (3B) includes a substrate (31) and a circuit portion (32). The substrate (31) has a first main surface (311) and a second main surface (312) facing each other. The circuit portion (32) is formed on the first main surface (311) side of the substrate (31). A material of the substrate (31) in the first chip component (3A) is the same as a material of the substrate (31) in the second chip component (3B). When a plane including a bonding region (923) with the bump (36) connected to the first chip component (3A) on the second main surface (92) of the mounting substrate (9) is defined as a reference plane (920), the first chip component (3A) and the second chip component (3B) have the same distance (H1) between the reference plane (920) and the second main surface (312) of the substrate (31) in a thickness direction (D1) of the mounting substrate (9).

The radio-frequency module (1; 1a; 1b; 1c; 1d; 1e; 1f; 1g) according to the second aspect can be reduced in height in the thickness direction (D1) of the mounting substrate (9).

In a radio-frequency module (1) according to a third aspect, in the first or second aspect, the first chip component (3A) is a first switch (4) for switching signal paths, and the second chip component (3B) is a second switch (5) for switching signal paths.

In a radio-frequency module (1a) according to a fourth aspect, in the first or second aspect, the first chip component (3A) is a first filter (transmission filter 12C), and the second chip component (3B) is a second filter (reception filter 22C). The first filter allows a first radio-frequency signal to pass therethrough. The second filter allows a second radio-frequency signal to pass therethrough.

In a radio-frequency module (1b) according to a fifth aspect, in the first or second aspect, the first chip component (3A) is a switch (first switch 4) for switching signal paths, and the second chip component (3B) is a low-noise amplifier (21). The low-noise amplifier (21) is provided in a signal path of a reception signal.

In a radio-frequency module (1c) according to a sixth aspect, in the first or second aspect, the first chip component (3A) is a switch (first switch 4) for switching signal paths, and the second chip component (3B) is a surface acoustic wave filter (transmission/reception filter 24). The surface acoustic wave filter is provided in the signal path.

In a radio-frequency module (1d) according to a seventh aspect, in the first or second aspect, the first chip component (3A) is a low-noise amplifier (21), and the second chip component (3B) is a surface acoustic wave filter (reception filter 22). The low-noise amplifier (21) is provided in a signal path for a reception signal. The surface acoustic wave filter (reception filter 22) is provided in a signal path for the reception signal.

A radio-frequency module (1d) according to an eighth aspect includes a plurality of the electronic components (2) in the seventh aspect. The plurality of electronic components (2) includes a power amplifier (11) and a filter (transmission filter 12). The power amplifier (11) is provided in a signal path for a transmission signal. The filter (transmission filter 12) is provided in a signal path for the transmission signal.

In a radio-frequency module (1f) according to a ninth aspect, in the first or second aspect, the first chip component (3A) is a switch (third switch 6), and the second chip component (3B) is a surface acoustic wave filter (reception filter 22A). The switch (third switch 6) is provided in a signal path for a reception signal. The surface acoustic wave filter (reception filter 22A) is provided in a signal path for the reception signal.

A radio-frequency module (1f) according to a tenth aspect includes a plurality of the electronic components (2) in the ninth aspect. The plurality of electronic components (2) includes a power amplifier (11) and a filter (transmission filter 12A). The power amplifier (11) is provided in a signal path for a transmission signal. The filter (transmission filter 12A) is provided in a signal path for the transmission signal.

In a radio-frequency module (1e) according to an eleventh aspect, in the first or second aspect, the first chip component (3A) is a low-noise amplifier (21), and the second chip component (3B) is a transmission filter (12). The low-noise amplifier (21) is provided in a signal path for a reception signal. The transmission filter (12) is provided in a signal path for a transmission signal.

A radio-frequency module (1e) according to a twelfth aspect includes a plurality of the electronic components (2) in the eleventh aspect. The plurality of electronic components (2) includes a power amplifier (11) and a reception filter (22). The power amplifier (11) is provided in a signal path for a transmission signal. The reception filter (22) is provided in a signal path for a reception signal.

In a radio-frequency module (1e) according to a thirteenth aspect, in the twelfth aspect, a mounting substrate (9) further includes a wiring portion (95). The wiring portion (95) electrically connects the reception filter (22) and the low-noise amplifier (21). The radio-frequency module (1e) further includes a ground terminal (85). The ground terminal (85) is arranged on the second main surface (92) of the mounting substrate (9). The ground terminal (85) is located between the low-noise amplifier (21) and the transmission filter (12) in a plan view from a thickness direction (D1) of the mounting substrate (9).

In the radio-frequency module (1e) according to the thirteenth aspect, the mounting substrate (9) includes the wiring portion (95) that electrically connects the reception filter (22) and the low-noise amplifier (21), whereby the parasitic capacitance between the wiring portion (95) and the ground layer of the mounting substrate (9) can be reduced as compared with the case where the reception filter (22) and the low-noise amplifier (21) are mounted on the second main surface (92) of the mounting substrate (9) and are connected by a wiring portion arranged along the second main surface (92) of the mounting substrate (9). In the radio-frequency module (1e) according to the ninth aspect, the ground terminal (85) positioned between the low-noise amplifier (21) and the transmission filter (12) is provided, whereby isolation between the low-noise amplifier (21) and the transmission filter (12) can be improved.

In a radio-frequency module (1*e*) according to a fourteenth aspect, in the thirteenth aspect, the ground terminal (85) is a columnar electrode.

In a radio-frequency module (1*g*) according to a fifteenth aspect, in the first or second aspect, the first chip component (3A) is a switch (third switch 6), and the second chip component (3B) is a transmission filter (12A). The switch (third switch 6) is provided in a signal path for a reception signal. The transmission filter (12A) is provided in a signal path for a transmission signal.

A radio-frequency module (1*g*) according to a sixteenth aspect includes a plurality of the electronic components (2) in the fifteenth aspect. The plurality of electronic components (2) includes a power amplifier (11) and a reception filter (22A). The power amplifier (11) is provided in a signal path for a transmission signal. The reception filter (22A) is provided in a signal path for a reception signal.

In a radio-frequency module (1; 1*a*; 1*b*; 1*c*; 1*d*; 1*e*) according to a seventeenth aspect, in any one of the first to sixteenth aspects, the substrate (31) of each of the first chip component (3A) and the second chip component (3B) is a silicon substrate.

In a radio-frequency module (1*a*) according to an eighteenth aspect, in the fourth aspect, the substrate (31) of each of the first chip component (3A) and the second chip component (3B) is a lithium tantalate substrate or a lithium niobate substrate.

A communication device (300; 300*a*; 300*d*) according to a nineteenth aspect includes a signal processing circuit (301) and the radio-frequency module (1; 1*a*; 1*b*; 1*c*; 1*d*; 1*e*) according to any one of the first to eighteenth aspects. The signal processing circuit (301) performs signal processing on a reception signal from an antenna (310) and a transmission signal to the antenna (310). The radio-frequency module (1; 1*a*; 1*b*; 1*c*; 1*d*; 1*e*) transmits a reception signal and a transmission signal between the antenna (310) and the signal processing circuit (301).

The communication device (300; 300*a*; 300*d*) according to the nineteenth aspect can be reduced in height in the thickness direction (D1) of the mounting substrate (9).

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
   a mounting substrate having a first main surface and a second main surface on opposite sides of the mounting substrate;
   an electronic component mounted on the first main surface of the mounting substrate; and
   a first chip component and a second chip component mounted on the second main surface of the mounting substrate,
   wherein the first chip component and the second chip component include:
      a substrate having a first main substrate surface and a second main substrate surface on opposite sides of the substrate; and
      a circuit portion formed on the first main substrate surface side of the substrate,
   wherein at least a part of the second main substrate surface of the substrate in each of the first chip component and the second chip component is exposed,
   wherein a material of the substrate in the first chip component and a material of the substrate in the second chip component are a same material, and
   wherein
      (1) the first chip component is a first switch that is configured to controllably switch signal paths and the second chip component is a second switch that is configured to controllably switch signal paths;
      (2) the first chip component is a switch that is configured to controllably switch signal paths and the second chip component is a low-noise amplifier provided in a signal path of a reception signal;
      (3) the first chip component is a switch that is configured to controllably switch signal paths and the second chip component is a surface acoustic wave filter provided in a signal path:
      (4) the first chip component is a low-noise amplifier provided in a signal path for a reception signal and the second chip component is a surface acoustic wave filter provided in a signal path for the reception signal;
      (5) the first chip component is a switch that is configured to controllably switch signal paths and the second chip component is a surface acoustic wave filter provided in a signal path for a reception signal;
      (6) the first chip component is a low-noise amplifier provided in a signal path for a reception signal and the second chip component is a transmission filter provided in a signal path for a transmission signal; or
      (7) the first chip component is a switch provided in a signal path for a reception signal and the second chip component is a transmission filter provided in a signal path for a transmission signal.

2. The radio-frequency module according to claim 1, wherein
   under a condition a plane including a bonding region with a bump connected to the first chip component on the second main surface of the mounting substrate is defined as a reference plane,
   the first chip component and the second chip component have a same distance between the reference plane and the second main substrate surface of the substrate in a thickness direction of the mounting substrate.

3. The radio-frequency module according to claim 1, wherein (1) the first chip component is the first switch that is configured to controllably switch signal paths and the second chip component is the second switch that is configured to controllably switch signal paths.

4. The radio-frequency module according to claim 1, wherein (2) the first chip component is the switch that is configured to controllably switch signal paths and the second chip component is the low-noise amplifier provided in the signal path of the reception signal.

5. The radio-frequency module according to claim 1, (3) wherein the first chip component is the switch that is configured to controllably switch signal paths and the second chip component is the surface acoustic wave filter provided in the signal path.

6. The radio-frequency module according to claim 1, wherein (4) the first chip component is the low-noise amplifier provided in the signal path for the reception signal and the second chip component is the surface acoustic wave filter provided in the signal path for the reception signal.

7. The radio-frequency module according to claim 6, wherein
   a plurality of the electronic component is included, and the plurality of electronic components includes:
- a power amplifier provided in a signal path for a transmission signal; and
- a filter provided in a signal path for the transmission signal.

8. The radio-frequency module according to claim 1, wherein (5) the first chip component is the switch that is configured to controllably switch signal paths and the second chip component is the surface acoustic wave filter provided in the signal path for the reception signal.

9. The radio-frequency module according to claim 8, further comprising:
- a power amplifier provided in a signal path for a transmission signal; and
- a filter provided in a signal path for the transmission signal.

10. The radio-frequency module according to claim 1, wherein (6) the first chip component is the low-noise amplifier provided in the signal path for the reception signal and the second chip component is the transmission filter provided in the signal path for the transmission signal.

11. The radio-frequency module according to claim 10, further comprising:
- a power amplifier provided in a signal path for a transmission signal; and
- a reception filter provided in a signal path for the reception signal.

12. The radio-frequency module according to claim 11, wherein
- the mounting substrate further includes a wiring portion that electrically connects the reception filter and the low-noise amplifier, and
- the radio-frequency module further includes a ground terminal arranged on the second main substrate surface of the mounting substrate and positioned between the low-noise amplifier and the transmission filter in a plan view from a thickness direction of the mounting substrate.

13. The radio-frequency module according to claim 12, wherein the ground terminal is a columnar electrode.

14. The radio-frequency module according to claim 1, wherein (7) the first chip component is the switch provided in the signal path for a reception signal and the second chip component is the transmission filter provided in the signal path for the transmission signal.

15. The radio-frequency module according to claim 14, further comprising:
- a power amplifier provided in a signal path for a transmission signal; and
- a reception filter provided in a signal path for the reception signal.

16. The radio-frequency module according to claim 1, wherein the substrate of each of the first chip component and the second chip component is a silicon substrate.

17. A communication device comprising:
- the radio-frequency module according to claim 1; and
- a signal processing circuit that performs signal processing on a reception signal from an antenna and a transmission signal to the antenna, wherein
- the radio-frequency module is configured to transmit the reception signal and the transmission signal between the antenna and the signal processing circuit.

18. A radio-frequency module comprising:
- a mounting substrate having a first main surface and a second main surface on opposite sides of the mounting substrate;
- an electronic component mounted on the first main surface of the mounting substrate; and
- a first chip component and a second chip component mounted on the second main surface of the mounting substrate,
- wherein the first chip component and the second chip component include:
  - a substrate having a first main substrate surface and a second main substrate surface on opposite sides of the substrate; and
  - a circuit portion formed on the first main substrate surface side of the substrate,
- wherein a material of the substrate in the first chip component and a material of the substrate in the second chip component are a same material,
- wherein, under a condition a plane including a bonding region with a bump connected to the first chip component on the second main surface of the mounting substrate is defined as a reference plane,
  - the first chip component and the second chip component have the same distance between the reference plane and the second main substrate surface of the substrate in a thickness direction of the mounting substrate, and
- wherein
  - (1) the first chip component is a first switch that is configured to controllably switch signal paths and the second chip component is a second switch that is configured to controllably switch signal paths;
  - (2) the first chip component is a switch that is configured to controllably switch signal paths and the second chip component is a low-noise amplifier provided in a signal path of a reception signal;
  - (3) the first chip component is a switch that is configured to controllably switch signal paths and the second chip component is a surface acoustic wave filter provided in a signal path;
  - (4) the first chip component is a low-noise amplifier provided in a signal path for a reception signal and the second chip component is a surface acoustic wave filter provided in a signal path for the reception signal;
  - (5) the first chip component is a switch that is configured to controllably switch signal paths and the second chip component is a surface acoustic wave filter provided in a signal path for a reception signal;
  - (6) the first chip component is a low-noise amplifier provided in a signal path for a reception signal and the second chip component is a transmission filter provided in a signal path for a transmission signal; or
  - (7) the first chip component is a switch provided in a signal path for a reception signal and the second chip component is a transmission filter provided in a signal path for a transmission signal.

* * * * *